US006919415B2

(12) United States Patent
Holmes et al.

(10) Patent No.: US 6,919,415 B2
(45) Date of Patent: Jul. 19, 2005

(54) POLYMERS FOR USE IN OPTICAL DEVICES

(75) Inventors: Andrew Bruce Holmes, Cambridge (GB); Xiao-Chang Li, Cambridge (GB); Stephen Carl Moratti, Cambridge (GB); Kenneth Andrew Murray, Bath (GB); Richard Henry Friend, Cambridge (GB)

(73) Assignee: Cambridge Display Technology Ltd., Cambridge (GB)

( * ) Notice: Subject to any disclaimer, the term of this patent is extended or adjusted under 35 U.S.C. 154(b) by 137 days.

(21) Appl. No.: 10/642,097

(22) Filed: Aug. 15, 2003

(65) Prior Publication Data

US 2004/0059077 A1 Mar. 25, 2004

Related U.S. Application Data

(62) Division of application No. 09/561,847, filed on Apr. 28, 2000, now Pat. No. 6,723,811, which is a division of application No. 08/875,049, filed on Jun. 24, 1997, now abandoned.

(30) Foreign Application Priority Data

Dec. 28, 1994 (GB) .............................................. 9426288
May 19, 1995 (GB) .............................................. 9510156

(51) Int. Cl.$^7$ ................................................. C08F 4/04
(52) U.S. Cl. ................. 526/218.1; 526/260; 526/307.5; 528/378; 528/380
(58) Field of Search .............................. 526/218.1, 260, 526/307.5; 528/378, 380

(56) References Cited

U.S. PATENT DOCUMENTS

| | | | |
|---|---|---|---|
| 4,694,062 A | 9/1987 | Jenekhe et al. | |
| 5,185,100 A | 2/1993 | Han et al. | |
| 5,243,004 A | 9/1993 | Funatsu et al. | |
| 5,254,633 A | 10/1993 | Han et al. | |
| 5,317,169 A | 5/1994 | Nakano et al. | |
| 5,328,961 A | 7/1994 | Rossi et al. | |
| 5,789,600 A | 8/1998 | Sakai et al. | |

FOREIGN PATENT DOCUMENTS

| | | |
|---|---|---|
| EP | 0 633 614 A1 | 1/1995 |
| JP | 5-320635 | 12/1993 |
| WO | WO 90/13148 | 11/1990 |
| WO | WO 92/03490 | 3/1992 |
| WO | WO 92/03491 | 3/1992 |
| WO | WO 93/14177 | 7/1993 |
| WO | WO 94/03030 | 2/1994 |
| WO | WO 94/03031 | 2/1994 |
| WO | WO 94/15441 | 7/1994 |
| WO | WO 94/29883 | 12/1994 |

OTHER PUBLICATIONS

Jean Roncali; "Conjugated Poly(thiophenes): Synthesis, Functionalization, and Applications"; *Chem. Rev.*; 1992; pp. 711–738.

Yutaka Ohmori, Masao Uchida, Keiro Muro and Katsumi Yoshino; "Visible–Light Electroluminescent Diodes Utilizing Poly (3–alkylthiophene)"; *Japanese Journal of Applied Physics*; Sep. 21, 1991; vol. 30, No. 11B, pp. L1938–L1940.

Richard D. McCullough, Renae D. Lowe, Manikandan Jayaraman, and Deborah L. Anderson; "Design, Synthesis, and Control of Conducting Polymer Architectures: Structurally Homogeneous Poly (3–alkylthiophenes)"; *J. Org. Chem.*; 1993; pp. 904–912.

M.M. Bouman, E.E. Havinga, R.A.J. Janssen, and E.W. Maijer; Chiroptical Properties of Regioregular Chiral Polythiophenes; *Mol. Cryst. Liq. Cryst.*; 1994; pp. 1–10.

C. Della Casa, E. Salatelli, F. Andreani and P. Costa Bizzarri; "Synthesis of New Conducting Poly(2,5–thienylene)s Containing Alkylhydroxy and Alkylester Side Chains"; *Makromol. Chem., Macromol. Symp.*; 1992; pp. 233–246.

Jimmy Lowe and Steven Holdecroft; "Synthesis of Photosensitive Electronically Conducting Polythiophenes"; *Polym. Phys.*; 1994; pp. 297–298 (1994).

Paul L. Burn, A.B. Holmes, A. Kraft, A.R. Brown, D.D.C. Bradley and R.H. Friend; "Light–Emitting Diodes Based on Conjugated Polymers: Control of Colour and Efficiency"; *Mat. Res. Soc. Symp. Proc.*; 1992; vol. 247, pp. 647–654.

A.R. Brown, D.D.C. Bradley, J.H. Burroughes, R.H. Friend and N.C. Greenham; "Poly(p–phenylenevinylene) light–emitting diodes: Enhanced electroluniescent efficiency through charge carrier confinement"; *Appl. Phys. Lett.*; Dec. 7, 1992; pp. 2793–2794.

Chihaya Adachi, Shizuo Tokito, Tetsuo Tsutsui and Shogo Saito; "Electroluminescence in Organic Films with Three–Layer Structure"; *Japanese Journal of Applied Physics*; Feb. 1988; vol. 27, No. 2, pp. L269–L271.

Chihaya Adachi, Shizuo Tokito, Tetsuo Tsutsui and Shogo Saito; "Organic electroluminescent Device with a Three–Layer Structure"; *Japanese Journal of Applied Physics*; Apr. 1988; vol. 27, No. 4, pp. L713–L715.

Yuji Hamada, Chihaya Adachi, Tetsuo Tsutsui and Shogo Saito; "Blue–Light–Emitting Organic Electroluminescent Devices with Oxadiazole Dimer Dyes as an Emitter"; *Jpn. J. Appl. Phys.*; Jun. 1991; vol. 31, pp. 1812–1816.

(Continued)

*Primary Examiner*—Bernard Lipman
(74) *Attorney, Agent, or Firm*—Merchant & Gould P.C.

(57) ABSTRACT

Optical devices fabricated from solvent processible polymers suffer from susceptibility to solvents and morphological changes. A semiconductive polymer capable of luminescence in an optical device is provided. The polymer comprises a luminescent film-forming solvent processible polymer which contains cross-linking so as to increase its molar mass and to resist solvent dissolution, the cross-linking being such that the polymer retains semiconductive and luminescent properties.

28 Claims, 14 Drawing Sheets

OTHER PUBLICATIONS

Katsuyuki Naito and Akira Miura; "Molecular Design for Nonpolymeric Organic Dye Glasses with Thermal Stability: Relations between Thermodynamic Parameters and Amorphous Properties"; *J. Phys. Chem.*; Feb. 12, 1993; pp. 6240–6248.

Paul L. Burn, Donal D.C. Bradley, Richard H. Friend, David A. Halliday, Andrew B. Holmes, Roger W. Jackson and Arno Kraft; "Precursor Route Chemistry and Electronic Properties of Poly(p–phenylene–vinylene), Poly[(2,5–dimethyl–p–phenylene)vinylene] and Poly [2,5–dimethoxy–p–phenylene)vinylene]"; *J. Chem. Soc.*; 1992; pp. 3225–3231.

Z. Yang, I. Sokolik and F.E. Karasz; "A Soluble Blue–Light–Emitting Polymer"; *Macromolecules*; Mar. 2, 1993; pp. 1188–1190.

Jimmy Lowe and Steven Holdcroft; "synthesis and Photolithography of Polymers and Copolymers Based on Poly(3–(2–(methacryloyloxy)ethyl)thiophene)"; *Macromolecules*; 1995; pp. 4608–4616.

X.C. Li et al.; Symposium W: Electrical, Optical, and Magnetic Properties of Organic Solid State Materials; *Mater. Res. Soc. Symp. Proc.*; Nov. 26–Dec. 1, 1995; pp. 13–22.-

45 a x:y 19:1
 b x:y  9:1
 c x:y  4:1

Representative polythiophenes for cross linking

Cross linking of 9:1 copolymer 45b; before heating (open circles), after 30 mins. at 200°C, 0.1 mmHG (open squares, dotted), after washing with chloroform (solid squares) and the same, in contact with chloroform (dot circles).

UV:VIS absorption spectra of *inter al.* copolymer 49 ( —————— ).

Photoluminescence spectrum of polymethacrylate 49 with 3 functional groups.

UV−VIS absorption change vs. UV light exposure time of the 3−unit copolymer

POLYMERS FOR USE IN OPTICAL DEVICES

This application is a divisional of U.S. application Ser. No. 09/561,847 that was filed with the United States Patent and Trademark Office on Apr. 28, 2000, now U.S. Pat. No. 6,723,811. U.S. application Ser. No. 09/561,847 is a divisional of U.S. application Ser. No. 08/875,049 that was filed with the United States Patent and Trademark Office on Jun. 24, 1997, and is now abandoned. The entire disclosures of U.S. application Ser. No. 09/561,847 and U.S. application Ser. No. 08/875,049 are incorporated herein by reference.

FIELD OF THE INVENTION

The invention relates to polymers for use in optical devices such as photoluminescent and electroluminescent devices.

BACKGROUND TO THE INVENTION

Polymer LEDs were first described by Burroughes et al (PCT GB90/00584). Devices based on copolymers (Holmes et al, PCT GB91/01420; PCT GB91/01421) multilayers (PCT GB93/01573; PCT GB93/01574) and with high electron affinity polymers have also been reported (PCT GB94/01118).

Conjugated poly(3-alkylthienylene)s have been prepared, and reviewed by J. Roncali (*Chem Rev*, 1992, 92, 711) and applications in electroluminescent devices were reported by Y. Ohmori et al. (*Jpn. J. Appl. Phys. Part 2*, 1991, 20(11B), L1938–1940. Regioregular poly(3-alkylthienylene)s have been described by R. D. McCullough, R. D. Lowe, M. Jayaraman, and D. L. Anderson, (*J. Org. Chem.*, 1993, 58, 904). Solvent dependent chiroptical behaviour has been reported for regioregular poly(3-alkylthienylene)s M. M. Bouman, E. E. Havinga, R. A. J. Janssen and E. W. Meijer, *Mol. Cryst. Liq. Crist.*, 1994, 256, 439). Regiorandom hydroxy-functionalised polythiophene copolymers have been reported (C. Della Casa, E. Salatelli, F. Andreani and P. Costa Bizzarri, *Makromol. Chem. Makromol. Symp.*, 1992, 59, 233), and the potential for cross linking was noted (J. Lowe and S. Holdcroft, *Polym. Prepr.*, 1994, 35, 297–298).

More advanced polymeric LEDs can involve the use of both emissive and charge transport materials in order to improve the efficiency of the device [P. L. Burn, A. B. Holmes, A. Kraft, A. R. Brown, D. D. C. Bradley, R. H. Friend, *Mat. Res. Soc. Symp. Proc.*, 1992, 247, 647; A. R. Brown, D. D. C. Bradley, J. H. Burroughes, R. H. Friend, N. C. Greenham, P. L. Burn, A. B. Holmes and A. Kraft, *Appl. Phys. Lett.*, 1992, 61, 2793; T. Nakano, S. Doi, T. Noguchi, T. Ohnishi Y. Iyechika, Sumitomo Chemical Company Limited, U.S. Pat. No. 5,317,169, May 31, 1994].

Emissive polymers are the main active layer in polymer LEDs. Singlet excitons are formed under double charge injection which then decay radiatively to produce light emission. On the other hand, charge transport polymers have also been found to play an important role in enhancing the internal quantum efficiency of devices (photons emitted per electron injected), decreasing working voltages and in increasing the life-time of the devices. This was first shown by use of the known charge transporting molecule (PBD) [2-(4-biphenyl)-5-(4-tert-butyl-phenyl)-1,3,4-oxadiazole] as a blend in poly(methyl methacrylate) as mentioned above [Burn et al.; Nakano et al.]. Recently, high efficiency (4%) blue electroluminescence has been achieved by means of charge-transporting layers using polyvinylcarbazole (PVK) as a hole-transporting material and PBD-blended with poly (methyl methacrylate) (PMMA) as an electron transporting material in the multi-layer device [ITO/PVK/PQ (polyquinoline)/PBD+PMMA/Ca] [I. D. Parker, Q. Pei, M. Marrocco, *Appl. Phys. Lett.*, 1994, 65(10), 1272]. The role of the charge transport layer in LEDs include: (i) assisting effective carrier injection from the electrode to the emitting layer (ii) confining the carriers within the emitting layer and thus increasing the probability of recombination processes through radiative decay, leading to light emission (iii) preventing the quenching of excitons at the boundary between an emitting material and the electrode.

Most common conjugated polymers are more easily p-doped and thus exhibit hole-transport properties. On the other hand, electron transport and electron injection in polymer LEDs have proved to be more difficult and are thus required in order to improve device efficiency and performance.

An aromatic oxadiazole compound such as PBD is well known to be a useful electron transport material [K. Naito, *Jpn. Kokai Tokkyo Koho*, JP 05,202,011,1993; S. Lunak, M. Nepras, A. Kurfurst and J. Kuthan, *Chem. Phys.*, 1993, 170, 67]. Multi-layered LED devices with improved efficiency have been reported using evaporated PBD or a spin-coated PBD/PMMA blend as an electron transport layer.

In each case, however, problems that will lead to device breakdown (such as the aggregation and re-crystallisation of PBD) may be expected to occur under the influence of an electrical field or temperature increase when the device is working [C. Adachi, et al, *Jpn. J. Appl. Phys.*, 1988, 27, L269; C. Adachi, S. Tokito, T. Tsutsui, S. Saito, *Jpn. J. Appl. Phys.* 1988, 27, L713; Y. Hamada, C. Adachi, T. Tsutsui, S. Saito, *Jpn. J. Appl. Phys.* 1992, 31, 1812; K. Naito, A. Miura, *J. Phys. Chem.*, 1993, 97, 6240].

Conjugated polymers that contain aromatic and/or heteroaromatic rings have enjoyed considerable interest because of their potential electrical conductivity after being doped and electroluminescent properties. However, there is a severe processibility problem for conjugated polymers as they are usually insoluble or infusible because of the rigidity of the main polymer chain and strong intermolecular forces between polymer chains. One way to improve the processibility of these polymers is to prepare a soluble precursor which can then be converted into a rigid conjugated polymer, as can be done with poly(p-phenylenevinylene) (PPV) (A) [A green yellow emitter, prepared by the sulfonium precursor route: P. L. Burn, D. D. C. Bradley, R. H. Friend, D. A. Halliday, A. B. Holmes, R. W. Jackson and A. Kraft, *J. Chem. Soc., Perkin Trans.*, 1992, 1, 3225]. Another way is to generate a fully conjugated material while increasing solubility by attaching bulky and flexible alkyl or alkoxy groups onto the main chain thereby weakening the intermolecular forces (as shown in the case of alkyl- or alkoxy-substituted PPV in (B) and (C)). A third way is to attach or insert a photoluminescent chromophore to a flexible polymer chain since the flexible chain segments will enhance the solubility in conventional organic solvents. This has been shown in the case of a block copolymer consisting of π-conjugated active blocks sandwiched between non-active flexible blocks [R. Gill, G. Hadziioannou, J. Herrema, G. Malliaris, R. Wieringa, J. Wildeman, WPI Acc. No. 94-234969; Z. Yang, I. Sokolik, F. E. Karasz, *Macromolecules*, 1993, 26(5), 1188; Sumitomo Chem.Co.Ltd., JP 5320635].

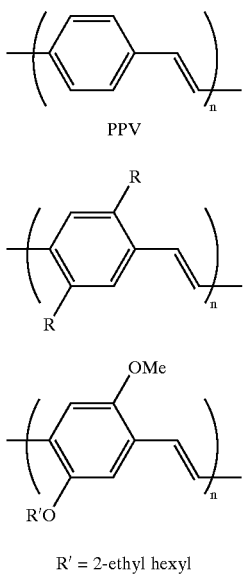

R' = 2-ethyl hexyl

In order to improve the performance of polymer LEDs, the luminescent polymer needs to be used in association with a charge transport polymer. Conventionally, charge transport materials may be used as single layers between the emitting layer and the electrodes. Alternatively, blends may be used.

Thus, prior art polymers used in optical devices suffer from susceptibility to solvents and morphological changes owing to low glass transition temperatures. Moreover, when molecular electron transport materials are used in such optical devices, problems involving the aggregation and recrystallisation of the material may lead to device breakdown.

SUMMARY OF THE INVENTION

In one aspect, the present invention provides a semiconductive polymer capable of luminescence in an optical device, such as a photoluminescent or electroluminescent device. The polymer comprises a luminescent film-forming solvent processible polymer which contains cross-linking so as to increase its molar mass and to resist solvent dissolution, the cross-linking being such that the polymer retains semiconductive and luminescent properties.

By increasing the molar mass of the polymer the deleterious effects of susceptibility to solvents and morphological change owing to low glass transition temperatures are avoided. Surprisingly, the cross-linked polymers retain their semiconductive and luminescence properties. Luminescent and electroactive polymer thin films such as those used in optical devices may therefore be stabilised. Because the thin films resist dissolution in common solvents this enables deposition of further layers of, for example, electroactive polymer films by solvent coating techniques thereby facilitating device manufacture. The cross-linked semiconductive polymers retain all their desirable luminescence properties and have the advantage of exhibiting enhanced morphological stability under device operation.

The cross-linking may be formed in the semiconductive polymer by thermal cross-linking, chemical cross-linking or photochemical cross-linking. Cross-linking methodology for polymers is well-known. For example, the cross-linking of polymers for photoresists by thermal, chemical and photochemical methods has been reviewed; (S. Paul, *Cross Linking Chemistry of Surface Coatings*, in *Comprehensive Polymer Science*, G. Allen (Ed.), Pergamon, Oxford, 1989, Vol. 6, Ch.6, pp. 149–192; S. R. Turner and R. C. Daly, *Photochemical and Radiation-sensitive Resists*, in *Comprehensive Polymer Science*, G. Allen (Ed.), Pergamon, Oxford, 1989, Vol. 6, Ch.7, pp. 193–225; S. P. Pappas, *Photocrosslinking* in *Comprehensive Polymer Science*, G. Allen (Ed.), Pergamon, Oxford, 1989, Vol. 6, Ch.5, pp. 135–148). In addition, an example of cross linking of polymers through ring opening metathesis polymerization of cyclooctene-5-methacrylate was reported by B. R. Maughon and R H Grubbs, (*Polym. Prepr.*, 1995, 36, 471–472).

A particularly useful example of thermal cross-linking involves the use of azide groups usually attached to the polymer main chain by a spacer group. At a temperature typically in the range of 80° C. to 250° C. the aliphatic azide will either form a pyrazoline adduct with a double bond or decompose to form a highly reactive nitrene which can then form cross-links with other polymers. An aryl azide will behave similarly in the range 20° C. to 250° C. The spacer is advantageously non-rigid. Preferably the spacer comprises —$(CH_2)_n$— or —$(CH_2)_n$—Ar— in which n is an integer preferably in the range 2 to 20 and Ar is an aryl group, preferably a phenylene group. A good example of such a spacer is a —$(CH_2)_{11}$— group.

Chemical cross-linking may be effected using diisocyanates or activated dicarboxylic acid derivatives to react with terminal functional groups (e.g. —OH) on the soluble polymer. In this way urethane or ester linkages can be created. Alternatively, a low molecular weight bifunctional or polyfunctional compound (e.g. an epoxy resin) can be blended with the solvent processible polymer for the purpose of reacting chemically with existing functional groups (e.g. amino etc) in the polymer main chain or on the side chains of the polymer. Suitable cross-linking agents include formaldehyde or other aldehydes, bis or polyfunctional azides such as 1,6-bisazidohexane, and polyisocyanates.

Photochemical cross-linking may be effected by any side chain substituent capable of becoming activated upon irradiation with light of appropriate energy, usually UV light. For example, cinnamate esters will undergo [2+2]-cycloaddition under appropriate conditions, typically irradiation of the polymer film at ambient temperature with a medium pressure Hg lamp. Also, photolysis of alkyl or aryl azides over a wide temperature range, preferably −50° C. to +50° C., can generate reactive nitrene intermediates which can cross-link the polymer.

The luminescent film-forming polymer and the cross-linked form thereof according to the present invention may be luminescent either by virtue of a luminescent main chain or a luminescent side chain. The polymer may comprise any such film-forming polymer, including copolymers and oligomers. The luminescent main chain polymers have been described in PCT GB 90/00584 and PCT GB91/01420, for example. Such polymers include poly(arylene vinylene) derivatives. Particularly useful poly(arylenevinylene) polymers in the present invention include polymers of general formula B and which carry cross-linkable functionality as an attachment. Electroluminescent polyarylenes are also particularly useful in the present invention, including polyheteoarylenes, especially the polythiophenes. Polythiophene copolymers are known to be capable of luminescence and substituted poly(3-alkyl thienylenes) are preferred.

Statistical copolymers of substituted poly(3-alkylthienylene)s containing regioregular head to tail linkages can be made according to K. A. Murray, S. C. Moratti, D. R. Baigent, N. C. Greenham, K. Pichler, A. B. Holmes and R. H. Friend, in *Synth. Met.*, 1995, 69, 395–396 and then cross-linked. The side chain alkyl substituents or a fraction thereof carry functionality which can be employed in chemical, photochemical or thermal cross-linking processes.

Further examples of polymers having a luminescent main chain are those which have the electroluminescent segments in scheme 2 below forming part of the polymer main chain. In a preferred embodiment of the invention, the polythiophene copolymer is of the general formula

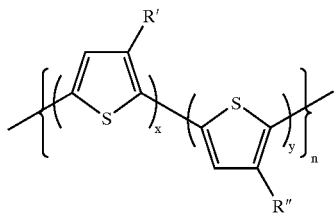

in which R' is a solubilising group, R" is a spacer group cross-linking the main chain to another polymer, and x, y and n are each integers, wherein x:y is in the range 19:1 to 1:2 and n is in the range 3 to 100.

Preferably, R' is —$C_6H_{13}$.

Where the polymer includes a luminescent side chain, this side chain may incorporate any luminophoric group such as a species containing at least 3 unsaturated units in conjugation. Preferably the luminescent side chain comprises a distyryl benzene. Where the polymer includes a luminescent side chain, there is no need for the main chain of the polymer itself to be luminescent but the polymer should be transparent to the emitted light. Various polymers may therefore be used to form the main chain. Especially useful polymers include polystyrenes, polyacrylates, polysiloxanes, and polymethacrylates which are preferred. Polymethacrylates are discussed in further detail below.

In one embodiment of the invention, the polymer further comprises a charge transport segment which is present in the polymer main chain or covalently linked thereto in a charge transport side chain.

In a further aspect of the invention a polymer is provided which is capable of charge transport, preferably electron transport, in an optical device such as an electroluminescent device. The polymer comprises a film-forming polymer which is solvent processable or formed from a processable precursor polymer and which includes a charge transport segment in the polymer main chain or covalently linked thereto in a charge transport side chain.

The polymers may be used as both charge transporting and/or electroluminescent materials in polymer light emitting devices. The polymers may therefore include charge transport functional segments and electroluminescent functional segments either as a side chain group or in the main chain of the polymer. Precursor polymers leading, after a conversion step, to intractable final polymers may be used, as well as fully processable polymers. Each type of polymer can have specific advantages in processing multi-layered structures.

The charge transport segment may comprise the moiety $Ar_1$-Het-$Ar_2$ in which $Ar_1$ and $Ar_2$ are the same or different from one another and are aromatic units. Examples of these aromatic units are set out below in Scheme 1. Het is a heteroaromatic ring, the electronic structure of which favours charge transport. Examples include oxidiazole, thiadiazole, pyridine, pyrimidine and their benzo-fused analogues such as quinoline. Heteroaromatic rings which are electron deficient and therefore enhance charge injection and transport are generally useful.

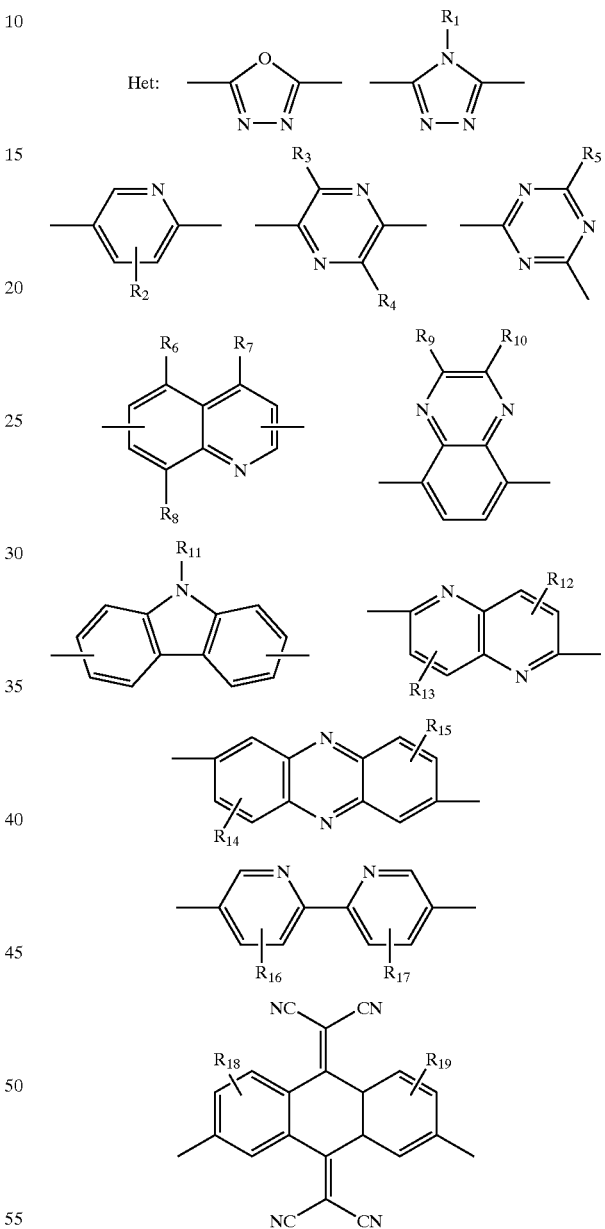

$Ar_1$, $Ar_2$ are aromatic, heteroaromatic, fused aromatic derivatives thereof, or double bonds:

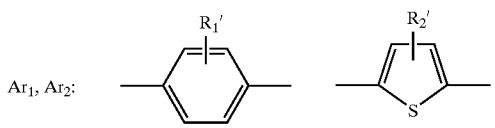

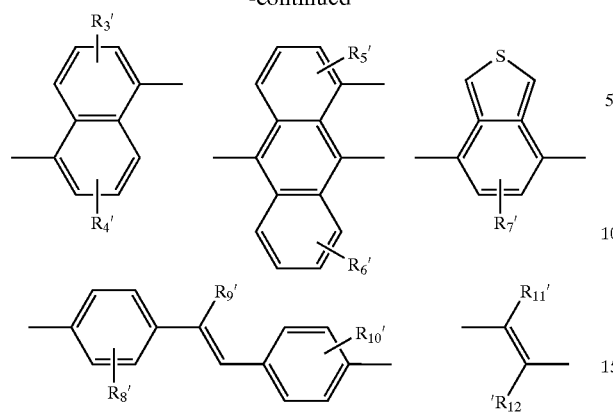

$R_{1-19}$ and $R_{1-12}$ are groups selected from the groups consisting of hydrogen and halogen atoms and cyano, alkyl and alkoxy side chains.

Scheme 2
Representative Electroluminescent Segments

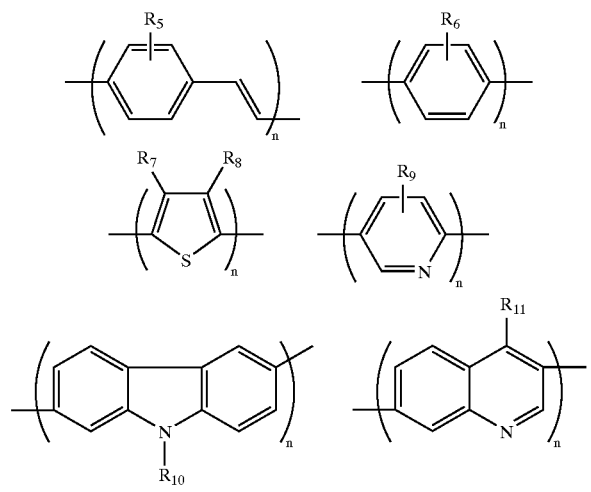

n = 2–10    $R_{5-11}$ = flexible alkyl or alkoxy solubulising and spacer groups The electroluminescent segments may comprise conjugated photoluminescent chromophore segments as illustrated in Scheme 2.

The side chair (co)polymer consists of any backbone polymer containing side chain modifications with luminescent and/or electron transporting segments. A typical example is a poly(methacrylate) that contains charge transport segments and/or luminescent segments in the pendant side group as shown in Scheme 3.

The side chain polymer may contain an optional third functional segment that will play a cross-linking role so as to improve the stability of the poly(methacrylate) i.e. by raising the glass transition temperature ($T_g$). The third segment may be a chemically cross-linkable group such as an epoxide, a thermally cross-linkable group such as an azide, or a photocross-linkable group such as a cinamate or a stilbene group.

Scheme 3
Illustration of a side chain copolymer (using poly(methacrylate) as an example)

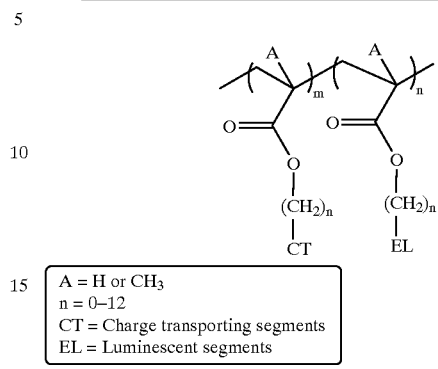

A = H or CH$_3$
n = 0–12
CT = Charge transporting segments
EL = Luminescent segments The main chain polymers and copolymers referred to herein are (co)polymers that contain transport segments and/or electroluminescent segments along the polymer or copolymer backbone with or without flexible spacers as illustrated by a representative example in Scheme 4.

The polymers described in the present invention are particularly suitable for use as electron transport layers in a multilayer LED device either as a blend with another electroluminescent polymer or as one of the components in a copolymer with another electroluminescent segment. This improves both the internal quantum efficiency and device performance.

Scheme 4
Representative Main Chain Polymer Structures

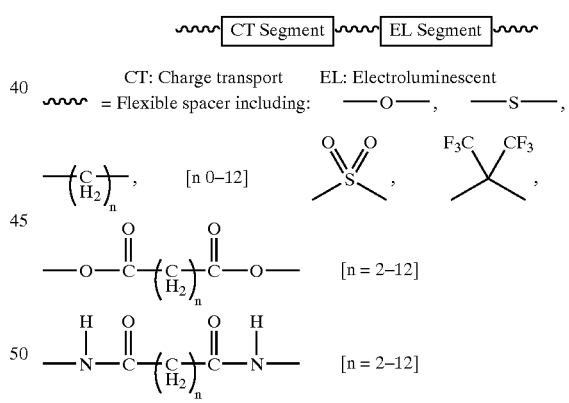

Scheme 5:
Synthesis of oxidiazole monomers

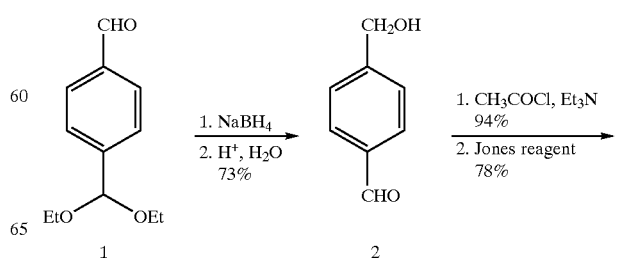

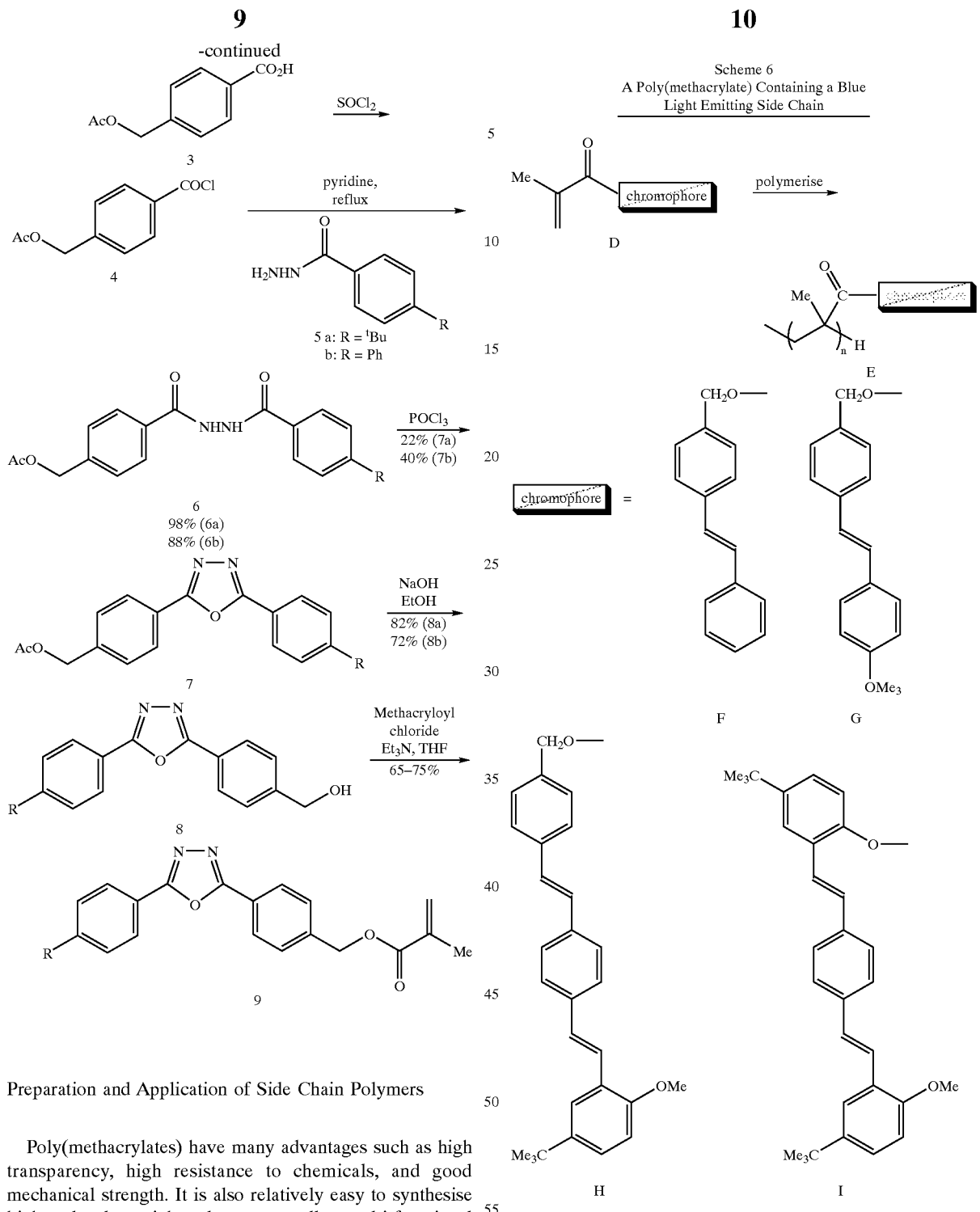

Preparation and Application of Side Chain Polymers

Poly(methacrylates) have many advantages such as high transparency, high resistance to chemicals, and good mechanical strength. It is also relatively easy to synthesise high molecular weight polymers as well as multi-functional copolymers.

To illustrate this general concept, a range of aromatic oxadiazole bonded polymers [especially poly(methacrylates)] have been synthesised and investigated incorporating monomers as shown in Scheme 5. These (co)polymers can be used in association with emissive polymers in different ways (single layer, blended layer and copolymer layer) to give devices with improved performance.

In a previous patent application (PCT/GB93/02856) a range of poly(methacrylate) derivatives containing chromophores D featuring blue emission were synthesised. The chromophoric groups F,G,H,I comprised two or three conjugated aryl rings (distyrylbenzene units) attached to the poly(methacrylate) chain via covalent linkages. This is a representative example of the numerous possibilities for blue size chain modified light emitting polymers. Crosslinking and copolymerisation with polymers carrying charge transporting segments make these materials particularly attractive candidates for blue light emission.

The polymer capable of charge transport is generally used in an optical device as a functional polymer layer between an electroluminescent polymer layer and a charge injection electrode. This layer plays a role in enhancing charge and especially electronic injection from the metal electrode (usually a cathode) and charge transport. The polymer may balance the charge injection in a multi-layer polymer LED with improvement of device performance.

In a further aspect, the present invention provides use of a polymer as described above in an optical device, preferably an electroluminescent device. The present invention also provides an optical device which comprises a substrate and a polymer as defined above supported on the substrate. The optical device is preferably an electroluminescent device. Typically, the polymer is used in such devices as a thin film. In operation the cross-linked semiconductive polymers retain desirable luminescent properties and have the advantage of exhibiting enhanced morphological stability.

The present invention will now be described in further detail, by way of example only, with reference to the accompanying drawings in which.

EXAMPLE 1

Figure 1:
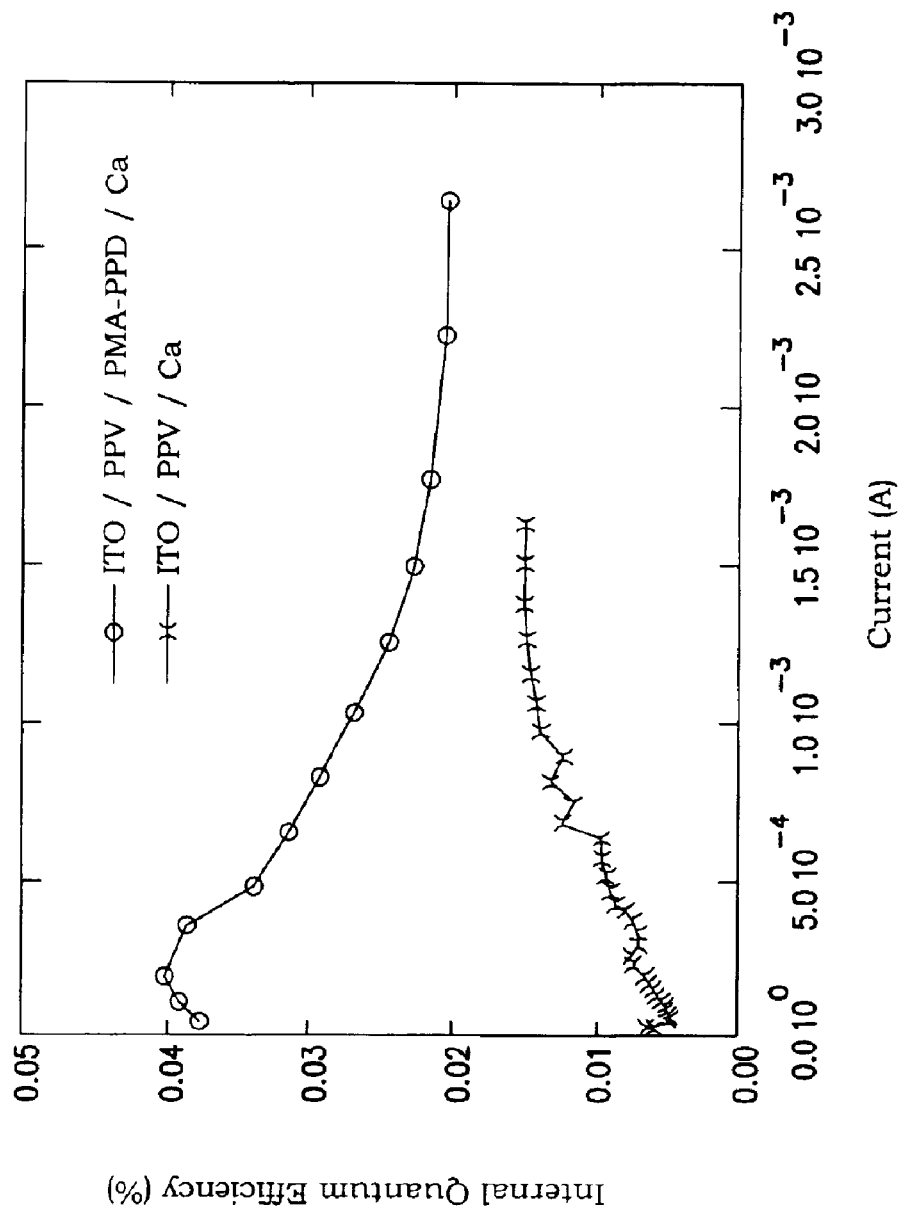
FIG. 1 shows a graph of internal quantum efficiency against current for the devices ITO/PPV/PMA-PPD/Ca and ITO/PPV/Ca.

The Synthesis of Methacrylate-PPD Monomer (9a)—Scheme 5

Preparation of aldehyde (2): Sodium borohydride(4.9 g, 0.13 mol) pellets were added to a solution of terephthaldehyde mono-(diethyl acetal) (39.9 g, 0.19 mol) in MeOH(150 ml) at 0° C. (using an ice bath). The reaction mixture was stirred for 1.5 h at 0° C. Water(100 ml) and HCl(10M, 200 ml) were added and the mixture stirred at room temperature for 1.5 h. After removing MeOH under reduced pressure, ethyl acetate(200 ml) was added. The organic layer was washed with sodium hydrogen carbonate solution and water. The clear organic layer was dried with anhydrous sodium sulfate. The crude product (20.35 g) was recrystallized from chloroform/hexane and was obtained as fine crystals(18.79 g, 73%); m.p.43–45° C.

Preparation of 4-(acetyloxy-methyl)benzoic acid (3): Triethylamine (15.4 ml, 110.4 mmol) was added to a solution of aldehyde (2) (12.57 g, 92.4 mmol) in THF (50 ml) and cooled to 0° C. Acetyl chloride (7.91 g, 110.4 mmol) was then gradually added over 25 minutes, and the mixture was then left to stir for two hours at room temperature. After one hour, ethyl acetate (200 ml) was added and the solution washed with sodium carbonate (100 ml), HCl (17%, 50 ml) and water (100 ml) respectively. The organic layer was then dried over sodium sulfate and the solvent removed under reduced pressure to give an oil which crystallised when cooled. Re-crystallisation in methanol-hexane gave light yellow crystals.

4-[acetyloxy-methyl]benzaldehyde: (15.39 g, 94%). m.p. 33–35° C.; $R_f$ 0.62(ether). $v_{max}$ (KBr)/cm$^{-1}$: 1735 s (O—C=O), 1686 s (H—C=O), 1608 m (phenyl absorption), 1384, 1369, 1253, 1212, and 811; $\lambda_H$ (250 MHz, CDCl$_3$) 2.10 (3H, s, CH$_3$), 5.14 (2H, s, CH$_2$O—), 7.41 (2H, d, J 8.1, Ar—H), 7.89 (2H, d, J 8.1, Ar—H) and 9.98 (1H, s, CHO). $\delta_C$ (63.5 MHz; CDCl$_3$) 20.8(CH$_3$), 65.4 (CH$_2$), 128.2, 129.9, 142.7, 141.8(phenyl carbons), 170.6 (O—C=O) and 191.8 (H—C=O).

4-[acetyloxy-methyl]benzaldehyde (15.3 g, 86.5 mmol) in acetone (250 ml) was then reacted with Jones reagent (33.0 ml, a three-fold excess) while stirring (exothermal reaction). This was stirred for 2 h before filtering out the green solid. The green solid was then dried under reduced pressure and dissolved in ethyl acetate(400 ml) and washed with sodium carbonate solution and water until neutral. After removal of solvent, a crop of yellow crystals (13.3 g) was obtained which was then recrystallised in chloroform-hexane to give a white crystal (3) (12.62 g, 76%). m.p.120–123° C.; $R_f$ 0.29 (1:1 Hexane-ether v/v).

Preparation of 4-tert-butyl benzoic hydrazide (5a): Hydrazine hydrate (9.4 ml, 194 mmol) was added to methyl 4-tert-butyl benzoate (25.3 g, 29 mmol) in ethanol (25 ml) and then refluxed under nitrogen for 18 h. The solvent was then removed under reduced pressure and the solid residue recrystallised from hot toluene-hexane (140 ml, 10:4 toluene-hexane v/v), to give colourless crystals of 4-tert-butyl benzoic hydrazide (19.25 g, 76%). m.p.126–128° C.

Preparation of 1-(p-tert-butyl benzoyl)-2-(4-acetyloxy-methyl-benzoyl)-hydrazine (6): Thionyl chloride(30 ml) was added to (3) (15.10 g, 77.8 mmol) in a 250 ml three-neck RB flask and refluxed for 40 minutes at 70–80° C. After removing the excess thinoyl chloride under vacuum, the brown oil (4) was then washed with chloroform (3×15 ml). The residue was then dissolved in dry pyridine(120 ml). Hydrazide (5a) (14.9 g, 77.8 mmol) was at last added. The brown solution was stirred and refluxed for 3 h before pouring the mixture into ice water (700 ml) to precipitate the product which was then washed with water and dried at 80° C. in vacuo to give the product. The product can be further purified by recrystallisation in toluene to give white crystals. m.p.229–230° C. (with liquid crystal behaviour and easy decomposition in air); $\delta_H$ (250 MHz, CDCl$_3$) 1.32(9H, s, $^t$Bu), 2.13(3H, s, CH$_3$CO), 5.13(2H, s, CH$_2$), 7.41(4H, t) and 7.81(4H, m, Ar—H), 9.59 and 9.72(2H, d, —NHNH—); $\delta_C$(63.5 MHz, CDCl$_3$) 20.9(CH$_3$), 31.1(C(CH$_3$)$_3$), 65.4 (CH$_2$), 125.7, 127.1, 127.6, 128.0, 128.3, 130.4, 131.1, 140.5(C), 156.1(C=O), 163.9 (C=O); $\nu_{max}$ (CHCl$_3$)/cm$^{-1}$: 3233(N—H), 1736(O—CO), 1672(NH—CO), 1633, 1445, 1450(phenyl absorption); [Found: C, 68.66; H, 6.64; N, 7.65. C$_{21}$H$_{24}$N$_2$O$_4$ requires C, 68.48; H, 6.52; N, 7.61%].

Preparation of 2-(para-tert-butyl-phenyl)-5-(4-acetyloxy-methyl-phenyl)-1,3,4-oxadiazole (7a): POCl$_3$ (35 ml) was added to (6a) (3.31 g, 8.99 mmol) and refluxed for 18 h under nitrogen. POCl$_3$ was distilled from the reaction mixture before pouring the residue into ice water. Extraction with ethyl acetate (2×200 ml) gave a yellow oil after removal of solvent. The crude product (TLC showed 3 spots) was purified by flash column chromatography using hexane-ether (10:1 to 3:7 v/v) yielding colourless crystals (7a) (1.02 g, 22%). m.p. 93–95° C.; R$_f$ 0.24 (1:1 hexane-ether v/v); $\delta_H$ (250 MHz, CDCl$_3$) 1.36 (9H, s, $^t$Bu), 2.14 (3H, s, CH$_3$CO), 5.18 (2H, s, CH$_2$), 7.54 and 8.07 (4H, m, Ar—H); $\sigma_C$ (63.5 MHz, CDCl$_3$) 21.0 (CH$_3$CO), 31.1 (C(CH$_3$)$_3$), 35.1 (C(CH$_3$)$_3$), 66.5 (CH$_2$), 121.1 and 126.1, 126.8, 139.7(Ar—CH$_2$OAc), 123.9, 127.1, 128.6, 155.5(Ar-$^t$Bu), 164.1(C) and 164.8 (C) and 170.7 (C=O); [found: C, 72.12; H, 6.29; N, 8.10. C$_{21}$H$_{22}$O$_3$N requires C, 72.0; N, 8.0; H, 6.3%]; m/z (EI) 350 (80), 335 (100%), 161 (30) and 43 (30) [Found: (M$^+$) 350.1630. C$_{21}$H$_{22}$O$_3$N requires M, 350.1630].

Preparation of 2-(para-tert-butyl-phenyl)-5-(4-hydroxyl-methyl-phenyl)-1,3,4-oxadiazole (8a): Oxadiazole (7a) (0.67 g, 1.91 mmol) was added to a solution of sodium hydroxide (0.11 g, 2.75 mmol) in ethanol (30 ml), and the mixture stirred for 2 h. The mixture was poured into aqueous sodium bicarbonate (5%, 100 ml) and a white precipitate which formed, was collected by filtration. The crude product (0.9 g) was recrystallised from CHCl$_3$-hexane yielding colourless crystals (8a) (0.53 g, 91%). m.p. 115–116° C.; R$_f$ 0.08 (1:1 hexane-ether v/v). $\nu_{max}$(CHCl$_3$)/cm$^{-1}$: 3308(OH), 2967(CH), 1615, 1552, 1495(Ar), 965(oxadiazole); $\delta_H$(250 MHz, CDCl$_3$) 1.36 (9H, s, (C(CH$_3$)$_3$), 2.22 (1H, t, OH), 4.79 (2H, d, CH$_2$O), 7.53 and 8.06 (8H, m, 2×Ar—H); d$_c$ (63.5 MHz, CDCl$_3$) 21.0 (CH$_3$CO), 31.1 (C(CH$_3$)$_3$), 35.1 (C(CH$_3$)$_3$), 64.5 (CH$_2$OH), 121.0 and 123.1 (aryl carbons bonded to oxadiazole ring), 126.1, 126.8, 127.1, 127.3(Ar) 144.7.0 (Ar—CH$_2$OH), 155.4 (Ar-$^t$Bu), 164.1 and 164.8 (C); [Found: C, 74.08; N, 9.03; H, 6.52; C$_{19}$H$_{20}$O$_2$N$_2$ requires C, 74.0; N, 9.1; H, 6.5%]; m/z (EI) 308 (55), 293 (100%), 161 (25) 135 (25), 116 (25) and 77 (25) [Found: (M$^+$) 308.1525. C$_{19}$H$_{20}$O$_2$N$_2$ requires M, 308.1525].

Preparation of monomer (9a) Triethylamine (1.0 ml, 41.0 mmol) was added to a solution or oxadiazole (8a) (0.61 g, 19.8 mmol) in THF (20 ml) and stirred under N$_2$. Methacryloyl chloride (0.9 ml, 84 mmol) was added slowly by syringe. The solution was stirred for 2 h at room temperature. Cloudiness was observed. Ether (100 ml) was added and the mixture was washed with water (100 ml), HCl (2M, 100 ml), and brine (100 ml). The combined aqueous washings were then extracted with more ether (100 ml). The combined ether layers were dried over anhydrous sodium sulfate and the solvent removed under reduced pressure to give an off-white solid. R$_f$=0.38 (1:1 hexane-ether v/v). After purification using flash column chromatography with ether-hexane(1:1 v/v), and drying, (8a) was obtained as colourless crystals (0.67 g, 91%). m.p. 106–109° C.; $\nu_{max}$ (CHCl$_3$)/cm$^{-1}$: 2966(C—H), 1720 s (C=O), 1615, 1494(Ar), 965 (oxadiazole); $\delta_H$ (250 MHz, CDCl$_3$) 1.36 (9H, s, $^t$Bu), 1.99 (3H, t, J 1.313, CH$_3$), 5.27 (2H, s, CH$_2$), 5.63, 6.20(2H, 2, CH=CH), 7.55 and 8.10 (8H, m, 2×Ar—H); XXX$\delta_C$ (100 MHz, CDCl$_3$) 18.3 (CH$_3$), 31.1 (C(CH$_3$)$_3$), 35.1 (CMe$_3$), 65.7 (CH$_2$—O), 121.0 and 123.8 (Ar), 126.1, 126.2, 126.8, 127.1, 128.4, 139.8 and 155.5 (Ar), 164.0 and 164.7 (carbons in the heterocycle), and 167.0 (C=O); [Found: C, 73.40; H, 6.35; N, 7.50; C$_{23}$H$_{24}$O$_3$N$_2$ requires C, 73.4, H, 6.4, N, 7.4%]. m/z (EI) 376 (80), 361 (100%), 161(40), 69(40) and 41(65) [Found: (M$^+$) 376.1787. C$_{23}$H$_{24}$O$_3$N$_2$ requires M, 376.17868].

EXAMPLE 2

The Synthesis of Methacrylate Monomer PBD (9b):

Synthesis of 1-(4-phenyl-benzoyl)-2-(4-acetyloxyl-methyl-benzoyl)-hydrazine (6b): The synthesis is similar to that of (6a) except hydrazide (5b) was used instead of hydrazide (5a). After isolating the clay-like solid, it was recrystalised in 95% ethanol and dried at 100° C. under vacuum to give white crystals (6b) (88%). R$_f$ 0.28 (ether); $\delta_H$ (250 MHz, CDCl$_3$) 2.13 (3H, s, CH$_3$), 5.15(2H, s, CH$_2$), 7.44 (5H, m, Ar—H), 7.65, 7.92 (8H, m, Ar—H); $\delta_C$ (63.5 MHz, CDCl$_3$) 20.9 (CH$_3$), 65.4 (CH$_2$), 127.2, 127.8, 128.0, 129.0, 130.0, 131.0 (Ar), 139.8 (Ar-Ph$_2$), 140.5 (CC=O), 145.1 (CCH$_2$), 164.7(C=O), 170.7 (C=O). $\nu_{max}$ (chloroform)/cm$^{-1}$: 3407, 3234(N—H), 3013(C—H), 1736 (CO—O), 1635, 1448(Ar), 965 (oxadiazole). [Found C, 69.8; H, 5.1; N, 7.0; C$_{25}$H$_{20}$N$_2$O$_3$ requires C, 71.11; H, 5.19; N, 7.21%].

Synthesis of 2-(biphenyl)-5-(4-acetyloxy-methyl-phenyl)-1,3,4-oxadiazole (7b): The cyclodehydration of (6b) to form (7b) is similar to the preparation of (7a). Thus, (6b) (11.95 g, 30.76 mmol) was dissolved in POCl$_3$ (40 ml). After refluxing for 6 h, POCl$_3$ was removed by distillation before pouring the residue into ice water to obtain a light grey powder which was then washed with water (5×200 ml) until neutral. The crude product was purified by flash column chromatography using hexane-ether(1:1, v/v). (7b) was obtained as colourless crystals(5.57 g, 40%). m.p.130–132° C.; R$_f$ 0.71 (ether); $\delta_H$ (250 MHz, CDCl$_3$) 2.16(3H, s, CH$_3$), 5.20(2H, s, CH$_2$), 7.50, 7.72 and 8.22(13H, m, Ar—H); $\delta_C$ (63.5 MHz, CDCl$_3$) 20.9 (CH$_3$CO), 65.5 (CH$_2$), 122.6, 123.7(C-oxadiazole), 127.1, 127.3, 127.4, 127.7, 128.2, 128.6, 129.0 (Ar), 139.8, 144.6 (C-Ph), 164.3, 164.6 (oxadiazole), 170.7 (C=O); $\nu_{max}$ (chloroform)/cm$^{-1}$: 3013 (C—H), 1737(CO—O), 1614, 1550, 1484(Ar), 965 (oxadiazole). [Found C, 74.76; H, 4.75; N, 7.54; C$_{23}$H$_{18}$N$_2$O$_3$ requires C, 74.58; H, 4.90; N, 7.56.0%].

Synthesis of 2-biphenyl-5-(4-hydroxyl-methyl-phenyl)-1,3,4-oxadiazole (8b): (7b) (7.0 g, 18.9 mmol) and sodium hydroxide(1.33 g, 33.3 mmol) were dissolved in ethanol (95%, 350 ml) and stirred at room temperature for 3 h before pouring the reaction mixture into sodium carbonate solution (600 ml) to obtain a white precipitate. The product was then dissolved in ethyl acetate, washed with water(3×300 ml) and dried with anhydrous sodium sulfate. The solvent was evaporated off and drying in vacuo yielded (8b) as fine white crystals (5.6 g, 90%). m.p.168–171° C.; R$_f$ 0.71 (ether); $\delta_H$ (250 MHz, CDCl$_3$) 2.25(1H, br, OH), 4.81(2H, s, CH$_2$), 7.48(5H, m, Ar—H), 7.70(4H, m, Ar—H) and 8.15(4H, m, Ar—H); $\delta_c$ (63.5 MHz, CDCl$_3$) 64.7 (CH$_2$), 122.7, 123.1 (C-oxadiazole), 127.2, 127.4, 127.7, 128.2, 129.0 (Ar), 139.8, 144.5 and 144.9 (C-Ph, CCH$_2$), 164.5 (oxadiazole);

$\nu_{max}$ (CHCl$_3$)/cm$^{-1}$: 3692, 3610(OH), 3015(H bonded OH), 1614, 1551 1484(Ar), 965(oxadazole). [Found: C, 76.87; H, 4.75; N, 8.27. C$_{21}$H$_{14}$N$_2$O$_2$ requires C, 76.81; H, 4.91; N, 8.54%].

Synthesis of methacrylate PBD monomer (9b): (8b) (3.86 g, 11.76 mmol) was dissolved in dry THF(150 ml) and dry triethylamine(12 ml, 0.49 mol), and stirred at 0° C. Methacryloyl chloride(3 ml, 0.28 mol) was then added dropwise with a syringe. After stirring for 2 h and then, warming up to room temperature, the cloudy solution was poured into ice water(600 ml) to get a white precipitate which was washed with water (5×150 ml) and then, dried to obtain the monomer (9b). TLC showed mainly one spot. R$_f$ 0.38 (1:1 44ether-hexane v/v). The crude monomer was then further purified with flash column chromatography using ether-hexane. (9b) was obtained as white crystals(3.78 g, 81%). m.p.123–125° C. (possible polymerisation). $\delta_H$ (250 MHz, CDCl$_3$) 2.01(3H, s, CH$_3$), 5.29(2H, s, CH$_2$), 5.64(1H, s, CH=C), 6.21(1H, s, CH=C), 7.50(5H, m, Ar—H), 7.72 (4H, m, Ar—H) and 8.22(4H, m, Ar—H). $\delta_C$ (63.5 MHz, CDCl$_3$) 18.4 (CH$_3$), 65.7 (CH$_2$), 122.7, 123.7(C-oxadiazole), 126.2, 136.0 (C=C), 140.0, 144.6, 127.2, 127.4, 127.7, 128.2, 128.4, 129.0 (Ar), 164.3 and 164.6 (oxadiazole), 167.1 (C=O); $\nu_{max}$ (CHCl$_3$)/cm$^{-1}$: 3012(C—H), 1717(CO—O), 1614, 1550, 1483 (Ar), 965 oxadiazole). [Found: C, 75.5; H, 4.9; N, 6.9. C$_{25}$H$_{20}$N$_2$O$_3$ requires C, 75.74; H, 5.08; N, 7.07%].

Scheme 7:
Synthesis of methacrylate monomer (16)

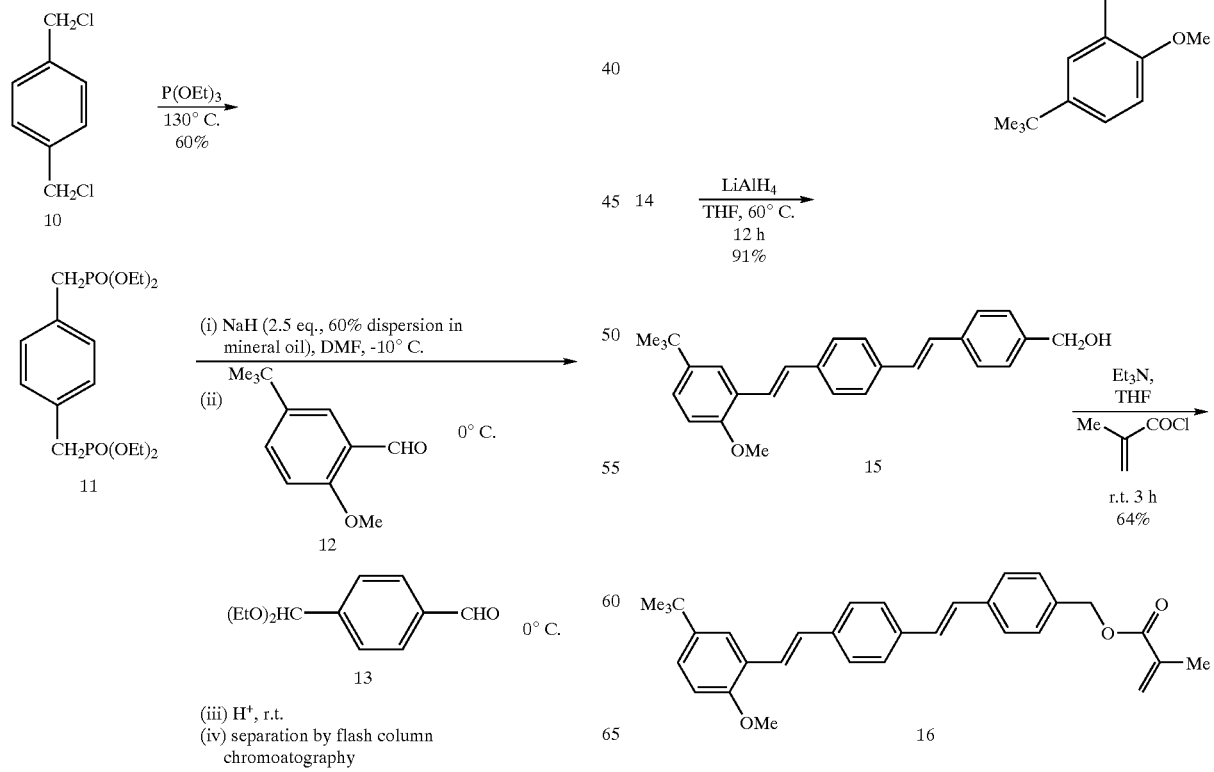

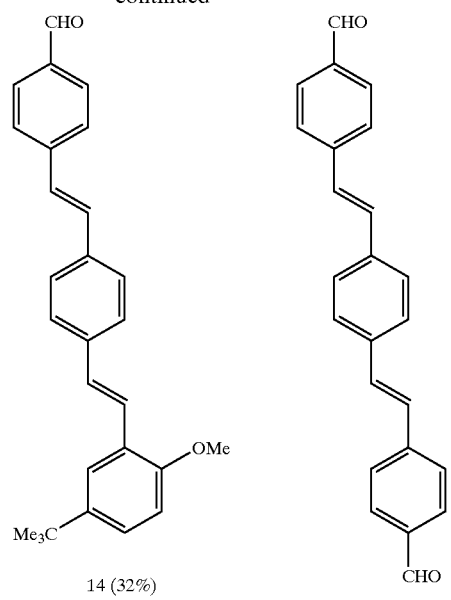

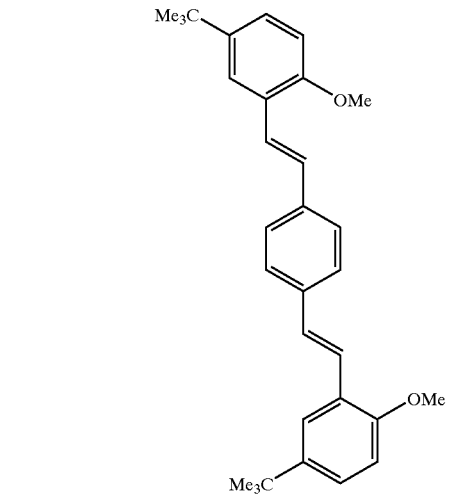

EXAMPLE 3

The Synthesis of Methacrylate Monomer TPV (16)
Synthesis of the Alcohol (15)

To a solution of the bis-phosphonate (11) (3.3 g, 8.73 mmol) in DMF (30 ml), cooled to 0° C., was added sodium hydride (1.0 g, 25.0 mmol, 60% dispersion in mineral oil). The reaction mixture was stirred for 15 minutes. The substituted benzaldehyde (12) (1.75 g, 9.1 mmol) and terepthalaldehyde mono(diethyl) acetal (12) (2 ml, 10.05 mmol) in DMF (10 ml) was then added from a dropping funnel and the reaction mixture was then stirred for 2 h at 0° C. in a cooling bath. HCl (3M, 10 ml) was added drop-by-drop to the cooled reaction mixture in order to destroy excess NaH and remove the acetal protecting group. The acidified mixture was stirred for 2 h at room temperature and then poured into a large excess of distilled water. The crude mixture of products (yellow solids) were filtered out under suction and dried in vacuo. TLC($CH_2Cl_2$) indicated three different compounds in the mixture of products. These compounds were separated by flash column chromatography ($CH_2Cl_2$). The desired aldehyde (14) was obtained (1.11 g, 32.1%).

The aldehyde (14) (1.1 g, 2.78 mmol) was dissolved in THF (30 ml) and cooled to 0° C. $LiAlH_4$ (0.2 g, 5.0 mmol) was added slowly in two portions. The mixture was then refluxed overnight at 60° C. Dilute acid (1M, 100 ml) was added, drop-by-drop to the cooled reaction mixture, to destroy excess $LiAlH_4$ and dissolve the alumina sludge formed. The aqueous mixture was extracted with $CH_2Cl_2$ (3×50 ml). The three $CH_2Cl_2$ portions were combined, washed with brine (50 ml), dried with anhydrous sodium sulfate and $CH_2Cl_2$ was evaporated off to yield the crude alcohol (15). The product was purified by flash column chromatography (eluting with 1:1 $CH_2Cl_2$-hexane to $CH_2Cl_2$ v/v) and was obtained as a yellowish-green solid (1.01 g, 2.54 mmol, 91%). [Overall yield: 29.1%); $R_f$ 0.53 ($CH_2Cl_2$); $v_{max}$(KBr)/$cm^{-1}$ 3386 (OH), 1493 (C=C), 1456 (C=C), 1362 (Ar), 1248 (C—O); $\delta_H$ (400 MHz, $CDCl_3$) 1.34 (9H, s, t-Bu), 3.87 (3H, s, $OCH_3$), 4.70 (2H, d, J 4.6, $CH_2$), 6.84 (1H, d, J 8.5, C=CH), 7.05–7.15 (3H, m, J 9.4 and 6.4, C=CH), 7.27 (1H, d, J 2.5, Ar—H), 7.36 (2H, d, J 8.1, Ar—H), 7.46–7.55 (7H, m, Ar—H), 7.59 (1H, d, J 2.5, Ar—H).

Synthesis of Methacrylate Ester (16)

To a solution of alcohol (15) (1.01 g, 2.54 mmol) and triethylamine (0.6 ml, 4.3 mmol) in dry $CH_2Cl_2$ (20 ml), was added methacryloyl chloride (0.4 ml, 4.09 mmol). The mixture was stirred at room temperature for 3 h. TLC ($CH_2Cl_2$) showed no presence of starting material (15). $CH_2Cl_2$ (80 ml) was added to the reaction mixture which was then washed with $Na_2CO_3$ (50 ml), HCl (1M, 50 ml) and brine (50 ml). The aqueous portions were extracted with a further portion of $CH_2Cl_2$ (50 ml). The two $CH_2Cl_2$ portions were combined, dried with anhydrous magnesium sulfate and $CH_2Cl_2$ was evaporated off to yield the crude ester (16). The product was purified using flash column chromatography (eluting with 1:6 $CH_2Cl_2$-hexane followed by 1:4 $CH_2Cl_2$-hexane v/v). The ester was obtained as a green solid which luminescences blue under uv radiation (0.76 g, 1.63 mmol, 64.2%). $R_f$ 0.13 (1:9 ether-hexane v/v); $v_{max}$(KBr)/$cm^{-1}$ 1716 (C=O), 1638 (C=C), 1603 (C=C), 1515 (Ar), 1494 (Ar), 1462 (Ar), 1156 (C—O); $\delta_H$ (400 MHz, $CDCl_3$) 1.34 (9H, s, t-Bu), 1.97 (3H, s, $CH_3$), 3.88 (3H, s, $OCH_3$), 5.19 (2H, s, $CH_2$), 5.59 (1H, s, C=CH), 6.16 (1H, s, C=CH), 6.84 (1H, d, J 8.6, C=CH), 7.05–7.14 (3H, m, J 11.0 and 5.2, C=CH), 7.28 (1H, d, J 2.4, Ar—H), 7.36 (2H, d, J 8.1, Ar—H), 7.46–7.56 (7H, m, Ar—H), 7.60 (1H, d, J 2.4, Ar—H); $\delta_C$ (100 MHz, $CDCl_3$) 167.29 ($CO_2$), 154.94 (C), 143.34 (C), 137.71 (C), 137.44 (C), 136.17 (C), 135.34 (C), 128.91 (C), 128.53 (C), 128.40 (C), 127.71 (C), 126.89 (C), 126.83 (C), 126.61 (CH), 125.85 (CH), 125.64 (C), 124.19 (CH) 123.55 (CH), 110.65 (CH), 66.22 ($CO_2CH_2Ar$), 55.65 ($OCH_3$), 34.19 ($CMe_3$), 31.56 ($C(CH_3)_3$), 18.37 ($CH_3$).

EXAMPLE 4

The polymerisation of Methacrylate PPD Monomer by Anionic Polymerisation (PMA-PPD-1)

Preparation of (2,6-di-tert-butyl-4-methylphenoxy) diisobutylaluminium [Al(BHT)$^i$Bu$_2$]: Di-tert-butyl-4-methylphenol (4.412 g, 20.0 mmol) was dissolved in toluene (20 ml). Triisobutyl aluminium (20 ml, 1M in toluene) was added by syringe, under $N_2$. The temperature was allowed to rise to 50° C. while butane gas was evolved. The mixture was then stirred at 50° C. for 1 h. The flask was sealed with a septum and the mixture used as a stock solution.

The Polymerisation:

n-Butyl lithium (0.05 ml, 15%) and Al(BHT)$Bu_2$ (1.5 ml) were dissolved in toluene (2 ml) and stirred under nitrogen for 30 mins at 0° C. A solution of the monomer (14) (0.33 g, 0.9 mmol) in toluene (2 ml) was at first slowly added dropwise and a yellow colour formed. The monomer was then run in more quickly. After 2 h, the colour had disappeared and the reaction appeared to have stopped. More BuLi (0.05 ml, 15%) was then added. After a further 3 h, no polymer was observed by TLC. The reaction was therefore terminated by adding methanol. $CH_2Cl_2$ (200 ml) and water (100 ml) were added and the polymer was found at the bottom of the flask. The polymer was then extracted with excess $CHCl_3$. The solvent was removed under reduced pressure and the resulting polymer dissolved in the minimum amount of $CHCl_3$, filtered through a sand filled pipette and added to MeOH(200 ml). The resulting white polymer was collected by filtration giving polymer (15) (ca. 50 mg), m.p. 190–230° C.; $v_{max}$(KBr)/$cm^{-1}$ 2961, 1734 s (C=O), 1617, 1495, 1138, 1067 and 842; $\delta_H$ (250 MHz, $CDCl_3$) 1.24 (12H, bs, α-$CH_3$ and $C(CH_3)_3$ group), 1.77 (2H, b, $CH_2$), 5.29 (2H, s, $CH_2$), 7.37 and 7.88 (2×4H, b, Ar—H); $\delta_c$ (63.5 MHz, $CDCl_3$) 31.0 ($CH_3$ and $C(CH_3)_3$), 35.0($C(CH_3)_3$) 44.9 ($CH_2$), 66.1 ($CH_2$—OH), 120.8, 123.8, 125.9, 126.6, 126.9, 129.1, 138.4, 155.2, 163.6 and 164.5 (Ar) and 176.5 (C=O). [Found: C, 64.6; H, 5.9; N, 6.3; $C_{23}H_{24}O_3N_2$ requires: C, 73.4; H, 7.4; N, 7.4%]; GPC assay revealed ($CHCl_3$, polystyrene as standard): $M_n$=36,000, $M_w$=489,000.

EXAMPLE 5

Polymerisation of methacrylate PPD monomer (9a) by radical polymerisation (PMA-PPD-2): Monomer (9a) (0.33 g, 0.89 mmol) was dissolved in AIBN solution in benzene (5 ml, 0.3 mg, 1.83×$10^{-6}$ mol). The ratio of AIBN/monomer is 0.21% (mol/mol). After removing ca. 4 ml of benzene in vacuo, the solution was thoroughly degassed by several freeze-thaw-pump cycles (five to eight times). The reaction mixture was stirred at 80° C. for 2 h before cooling down to room temperature. The viscous reaction mixture was poured into MeOH (10 ml) to obtain a white precipitate which was then, washed with MeOH(3×2 ml) and dried to yield crude polymer (9a) (0.22 g, 69%). The polymer was further purified by dissolving in chloroform and reprecipitation in MeOH (repeated 3 times). $\delta_C$ (250 MHz, $CDCl_3$) 0.67, 0.98(3H, b, α-$CH_3$), 1.24(9H, $C(CH_3)_3$), 1.87(2H, $CH_2$), 4.87(2H, b, $CH_2$), 7.37, 7.88(2×4H, Ar—H); $\delta_C$(100 MHz, $CDCl_3$) 16.9, 19.0(a-$CH_3$), 31.0($C(CH_3)_3$), 35.0($CMe_3$), 45.0($CH_2$), 54.1(CC=O), 66.1($CH_2OCO$), 120.8, 123.8, 125.9, 126.7, 126.9, 129.1, 138.5, 155.2(Ar), 163.7, 164.5 (oxadiazole), 176.8(C=O); $v_{max}$ (CHCl$_3$)/cm$^{-1}$: 2966(C—H), 1728(C=O), 1615, 1552, 1494(Ar), 964(oxadiazole); [Found: C, 72.69; H, 6.30; N, 7.22; C$_{23}$H$_{24}$N$_2$O$_3$ requires: C, 73.38; H, 6.43; N, 7.44%]; GPC assay revealed (CHCl$_3$, polystyrene as standard) M$_n$=52,000, M$_w$=127,000, M$_w$/M$_n$=2.46.

EXAMPLE 6

The Polymerisation of Mathacrylate PPD Monomer (9a) by Radical Polymerisation Method (PMA-PPD-3)

The polymerisation procedure is similar to Example 5 except AIBN was used as initiator (0.5% by mol with respect to amount of monomer). After purification by dissolving in CHCl$_3$ followed by precipitation into MeOH (repeated three times), polymer (9a) was obtained(55%). GPC assay revealed (CHCl$_3$, polystyrene as standard): M$_n$=34,000, M$_w$=103,000, M$_w$/M$_n$=2.99.

EXAMPLE 7

Polymerisation of Methacrylate PBD (9b) (PMA-PBD-1):

The polymerisation of monomer (9b) is similar to that of (9a) in Example 5. Thus, monomer (9b) (0.35 g of, 0.885 mmol) was dissolved in a benzene solution containing AIBN (5.4 ml, 0.73 mg AIBN) (AIBN/monomer=0.5%, by mol). Excess benzene was evaporated of in vacuo until ca. 0.5 ml to 1.0 ml of benzene remained in the reaction mixture. The solution was then completely degassed using several freeze-thaw-pump cycles (five to eight times). The reaction mixture was stirred at 80° C. under a N$_2$ atmosphere, for 2 h. On cooling to room temperature, the viscous reaction mixture was poured into methanol-acetone(20 ml, 1:1 v/v) to obtain a white precipitate. The polymer was then purified by repeatedly dissolving in CHCl$_3$ and precipitating into methanol-acetone (repeated 3 times). After drying in vacuo, (9b) was obtained as a white powdery solid(0.23 g, 66%). $\delta_H$(250 MHz, in CDCl$_3$) 0.66–0.98(3H, b, a-CH$_3$), 1.90(2H, b, CH$_2$), 4.86(2H, b, CH$_2$), 7.28, 7.47(9H, b, Ar—H), 7.85(4H, b, Ar—H); $\delta_C$(100 MHz, CDCl$_3$) 18.5(CH$_3$), 29.5 (CH$_3$), 44.9(CH$_2$), 65.7(CH$_2$), 122.7, 123.7(Ar-oxadiazole), 126.9, 127.2, 127.4, 127.7, 128.1, 128.4, 128.8 and 129.0 (Ar), 139.4, 144.5(Ar-Ph, Ar—CH$_2$O), 163.8(C, oxadiazole), 164.2(C, oxadiazole); $v_{max}$(KBr)/cm$^{-1}$: 3010 (C—H), 1730 (CO—O), 1614, 1550, 1484(Ar), 964 (oxadiazole); [Found: C, 74.44; H, 4.92; N, 6.66; C$_{25}$H$_{20}$N$_2$O$_3$ requires: C, 75.74; H, 5.08; N, 7.07%]; GPC assay revealed (CHCl$_3$, polystyrene as standard): M$_n$=89,000, M$_w$=103,000.

EXAMPLE 8

The Polymerisation of Mathacrylate Monomer PBD (9b) (PMA-PBD-2):

The polymerisation procedure is similar to Example 7 except chlorobenzene rather than benzene, was used as solvent. The polymer was then purified by repeatedly dissolving in CHCl$_3$ and precipitating into methanol-acetone (repeated three times). (9b) was obtained in 50% yield. GPC assay revealed (CHCl$_3$, polystyrene as standard): M$_n$=4,080, M$_w$=42,500.

EXAMPLE 9

The Polymerisation of Methacrylate TPV (16) (PMA-TPV):

The polymerisation of monomer (16) is quite similar to that of monomer (9). Thus, monomer (16) (0.205 g, 0.44 mmol) was dissolved in benzene solution (2.5 ml) containing 0.35 mg of AIBN (10.8 mg, 0.85 mmol). The solution was then concentrated by evaporating off some benzene in vacuo and then thoroughly degassed by using the freeze-thaw-pump method (repeated five times). The reaction mixture was then stirred at 80° C. for 2 h under an inert nitrogen atmosphere. The homopolymer was precipitated out in excess methanol and purified by dissolving in CHCl$_3$ and reprecipitation in excess MeOH (repeated twice). The polymer was dried overnight in vacuo and was obtained as a pale yellow powdery solid (0.11 g, 54%). $v_{max}$ (KBr)/cm$^{-1}$ 1720 (C=O), 1613 (C=C), 1514 (Ar), 1465 (Ar), 1150 (C—O); $\delta_H$ (400 MHz, CDCl$_3$) 0.5–1.1(b, backbone α-Me), 1.1–1.25 (b, backbone CH$_2$), 1.29 (9H, s, C(CH$_3$)$_3$), 3.74 (3H, s, OCH$_3$), 4.6–5.2 (2H, b, CO$_2$CH$_2$), 6.7–7.1 (2H, b, CH=CH), 7.1–7.7 (13H, b, CH=CH and Ar—H); $l_{max}$/nm (CHCl$_3$): 245, 324; GPC assay revealed (CHCl$_3$, polystyrene as standard) M$_n$=161,000, M$_w$=702,000, M$_w$/M$_n$=4.37.

EXAMPLE 10

'Screened' Anionic Polymerisation of Methyl Methacrylate of Methacrylate Monomer TPV (16) by Anionic Polymerisation:

10.1 Preparation of 2,6-di-tert-butyl-4-methylphenoxy) diisobutylaluminium [Al(BHT)$^i$Bu$_2$]

Di-tert-butyl-4-methylphenol (4.412 g, 20.0 mmol) was dissolved in toluene (20 ml). Triisobutyl aluminium (20 ml, 1M in toluene) was added by syringe, under N$_2$. The temperature was allowed to rise to 50° C. Butane gas was evolved. The mixture was then stirred at 50° C. for 1 h. The flask was sealed with a septum and the mixture was used as a stock solution.

10.2. Polymerisation of Methyl Methacrylate

A solution of Al(BHT)$^i$Bu$_2$ (3 ml, 1.5 mmol, 0.5M in toluene) was mixed with toluene (15 ml) in a 3 neck 100 ml RB flask fitted with a presure equalising dropping funnel, N$_2$ balloon and a septum. tert-Butyllithium (0.3 ml, 1.7M in pentane) was then added by syringe, with stirring. Several minutes were allowed to elapse to permit complete complexation of the two metal alkyls. Methyl methacrylate (MMA) (2 ml, 1.87 g, 18.7 mmol) was added drop-by-drop from the dropping funnel. The mixture was stirred at 0° C. for 1 h. The addition of MMA produced a pronounced yellow colour in the solution but on completion of the polymerisation, the solution is colourless. The polymer was precipitated out in excess hexane and dried in vaccuo overnight. Yield (1.7 g, 90%); m.p. 173–280° C.; $v_{max}$ (KBr)/cm$^{-1}$ (1731 (C=O), 1150 (C—O); $\delta_H$ (400 MH\, CDCl$_3$) 0.75–1.1 (b, 3H, α-CH$_3$), 1.7–2.1 (b, 2H, CH$_2$), 3.59 (s, 3H, CH$_3$); Tactility $\delta_H$ (triad, %); 0.83 (rr, 68.8%), 1.01 (mr, 31.2%). GPC in chloroform revealed M$_n$ 25,980, M$_w$/M$_n$= 1.35.

EXAMPLE 11

The Copolymerisation of Methacrylate PBD and TPV:

The copolymerisation of monomer (9b) and monomer (16) was been carried out using radical copolymerisation method that is similar to homopolymerisation. Thus, monomer (9b) (0.211 g., 0.532 mmol) and (16) (0.250 g, 0.537 mmol) were first dissolved in a benzene solution(6.5 ml) that contain 0.8839 mg of AIBN (AIBN/(17+18)=0.5%, by mol) to form a homogeneously dispersed solution. The solution was then concentrated to ca. 1 ml by evaporating off some benzene in vacuo and then, completely degassed by using the freeze-thaw-pump method (repeated five times). The reaction mixture was stirred at 80° C. for 2 h under an inert nitrogen atmosphere. After cooling down to room temperature, the viscous solution was poured into MeOH(20 ml) to obtain a white precipitate which was then further purified by repeatedly dissolving in chloroform and precipitating into methanol (repeated three times). The copolymer was obtained as a light yellow powdery solid(0.29 g, 63%).

$\delta_H$ (250 MHz, CDCl$_3$) 0.67–1.16(2×3H, b, 2×a-CH$_3$), 1.33 (9H, s, $^t$Bu), 1.61(4H, CH$_2$), 3.88(3H, OCH$_3$), 4.82(4H, s, CH$_2$), 6.72–7.9(24H, b, Ar—H); $\delta_C$(100 MHz, CDCl$_3$) 31.5(C(CH$_3$)$_3$), 34.1(CMe$_3$), 55.5(OCH$_3$), 110.5(CH═CH), 123.4, 124.0, 126.6, 127.0, 127.2, 127.4, 127.8, 128.2, 128.5, 129.0, 137.4(Ar); $v_{max}$(KBr)/cm$^{-1}$ 2949(C—H), 1724 (C═O), 1610, 1548(Ar), 961(oxadiazole); GPC assay revealed (CHCl$_3$, polystyrene as standard) M$_n$=44,000, M$_w$=242,000, M$_w$/M$_n$5.45.

EXAMPLE 12

Poly(methacrylate) PPD as Single Electron Transporting Layer:

In order to evaluate the applicability of the polymers in LED devices, two double layered LED devices have been fabricated using PPV as a hole transport layer and either aluminium or calcium as the negative electrode.

LED device fabrication: ITO glass was cleaned in an ultrasonic bath with detergent solution for 20 minutes and then rinsed with distilled water, acetone and isopropanol before drying in a stream of N$_2$. The dry and absolutely clean ITO glass substrate was then spin-coated with a PPV precursor solution(1% in methanol) at room temperature at 2000 rpm for 20 minutes. Thermal conversion of the PPV precursor was carried out at 280° C. in vacuo (ca. 0.1 mmHg) for 4 h to obtain a PPV layer (with thickness of ca. 40 nm). The PPV layer functions as both a hole-transport and light-emitting layer. The oxadiazole containing polymer PMA-PPD-2 (usually 2% in chloroform) was then spin-coated onto the converted PPV layer before depositing aluminium on the top to form the double layer LED device. The electrodes were led out using a copper adhesive tape strip and then covered with PVC adhesive tape to prevent contact with air.

| | |
|---|---|
| (1) ITO/PPV/PMA-PPD/Al | No light emission bellow 28 V |
| (2) ITO/PPV/PMA-PPD/Ca | Green yellow light emission |

Figure 2:
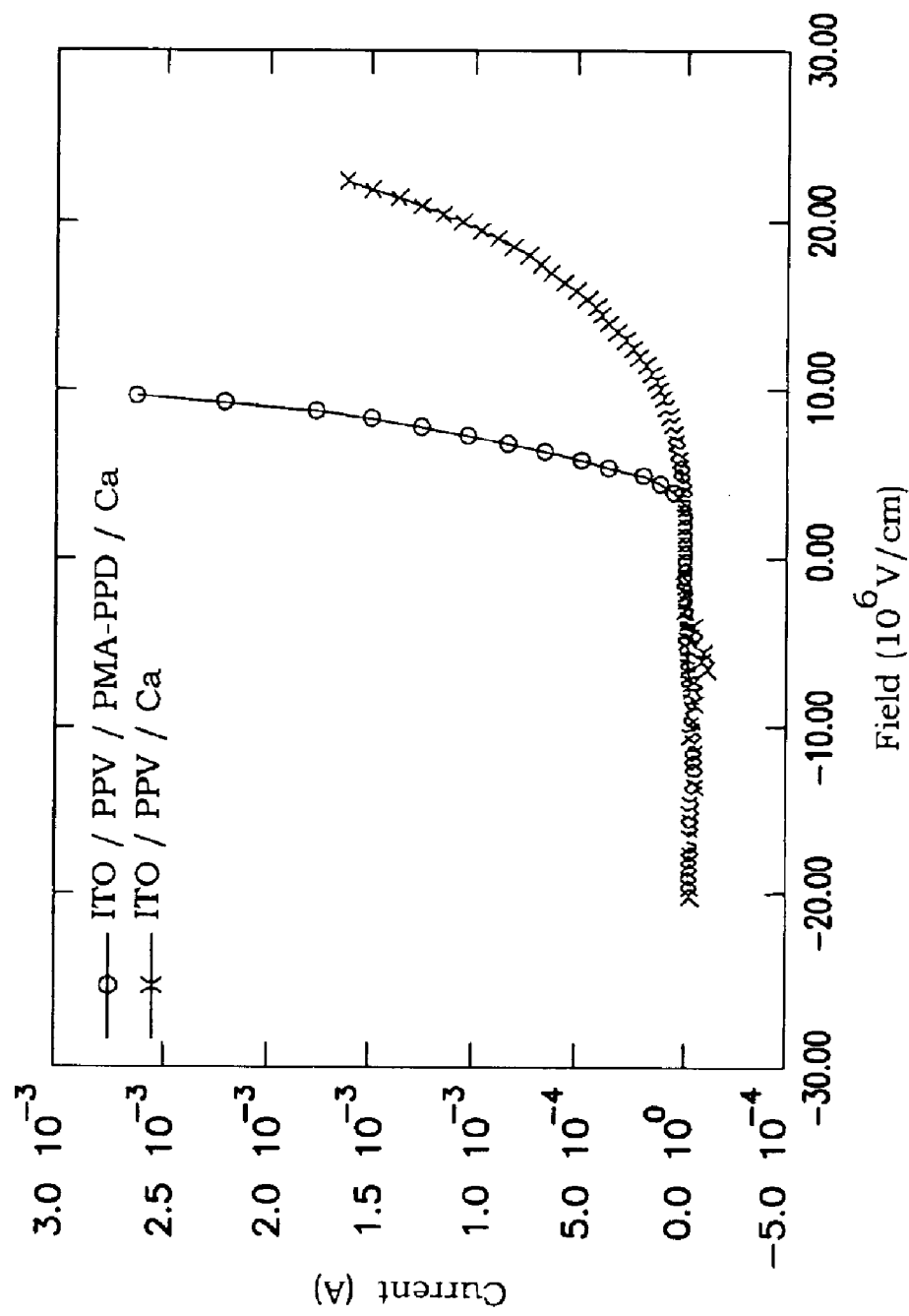
FIG. 2 shows a graph of current against field for the devices of FIG. 1.

The above results show that when aluminium is used as the negative electrode, incorporation of a PMA-PPD layer in the double layer device has no apparent benefits. However, light emission(below 28V) is enhanced when calcium is used as the cathode. FIG. 1 shows that the internal quantum efficiency of the double layer device(2) can be increased by about four folds, while the turn-on voltage is apparently reduced (FIG. 2).

EXAMPLE 13

Poly(methacrylate) (PPD) used as an Electron Transporting Layer in the Form or a Blend, with Stilbene Containing Poly(methacrylate) Derivative (TPV):

Alternatively, PMA-PPD has been used in a blend with a blue light-emitting polymer (PMA-TPV), with PPV being used as a hole transporting layer, in a series of devices. These devices were fabricated using the similar procedure described in Example 12, except PMA-TPV(2% in chloroform), and a blend solution of PMA-TPV and PMA-PPD-2(1:1 w/w in chloroform) were used instead.

| | |
|---|---|
| (3) ITO/PMA-TPV/Ca | No light emission |
| (4) ITO/PPV/PMA-TPV/Ca | No light emission |
| (5) ITO/PPV/Blend of PMA-TPV + PMA-PPD/Ca | Blue light emission and gradual change to green light emission |
| (6) ITO/PPV/PMA-TPV + PMA-PPD/Al | No light emission |

Figure 3:
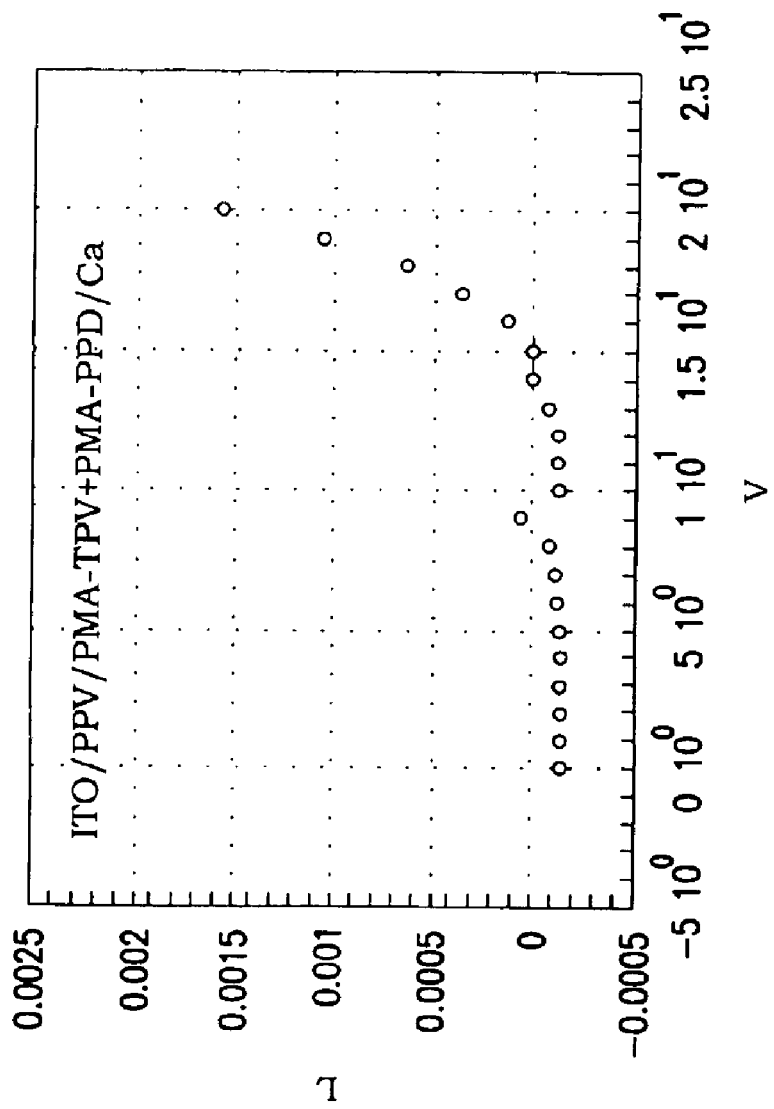
FIG. 3 shows a graph of luminance L against voltage V for the device ITO/PPV/PMA-TPV+PMA-PPD/Ca.
Figure 4:
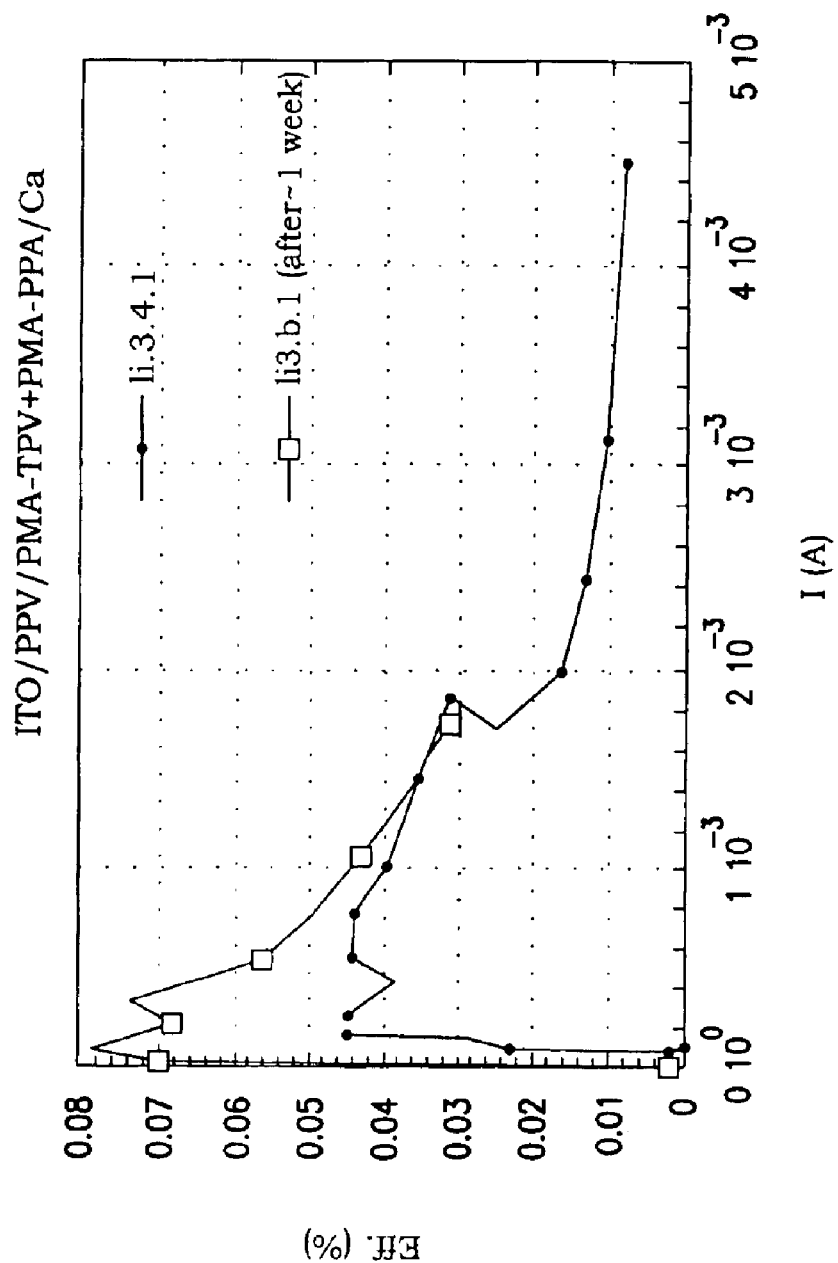
FIG. 4 shows a graph of efficiency against current for the device of FIG. 3.

These results suggest that PMA-TPV does not electroluminese bellow 28V unless an electron transporting polymer PMA-PPD is also used (device 3). For device 4, blue light emission was initially observed but the colour gradually changed to green within 20 minutes on continuous charge application at a bias voltage of ca. 15V(as shown in FIG. 3). FIG. 4b shows that the internal quantum efficiency of the device increased after storing the device for a week.

EXAMPLE 14

Poly(methacrylate) PBD as Single Electron Transport Layer:

According to the LED fabrication procedure described in Example 12, PMA-PBD-1 solution in chloroform was spin-coated onto a PPV layer, on an ITO glass substrate, thus forming a LED device using PMA-PBD as the electron transporting layer:

| | |
|---|---|
| (7) ITO/PPV/PMA-PBD/Ca. | Green light emission |

Green light emission was observed when a bias voltage of 15V was applied.

EXAMPLE 15

Poly(methacrylate) PBD used as Electron Transport Layer in the Form of a Blend with Poly(methacrylate) TPV as the Emitting Polymer:

A blend solution of PMA-PBD-1/PMA-TPV(1:1 w/w) in chloroform was used to spin-coat a film onto a layer of PPV, on an ITO glass substrate.

| | |
|---|---|
| (8) ITO/PPV/PMA-PBD + PMA-TPV/Ca. | Blue light emission |

Figure 5:
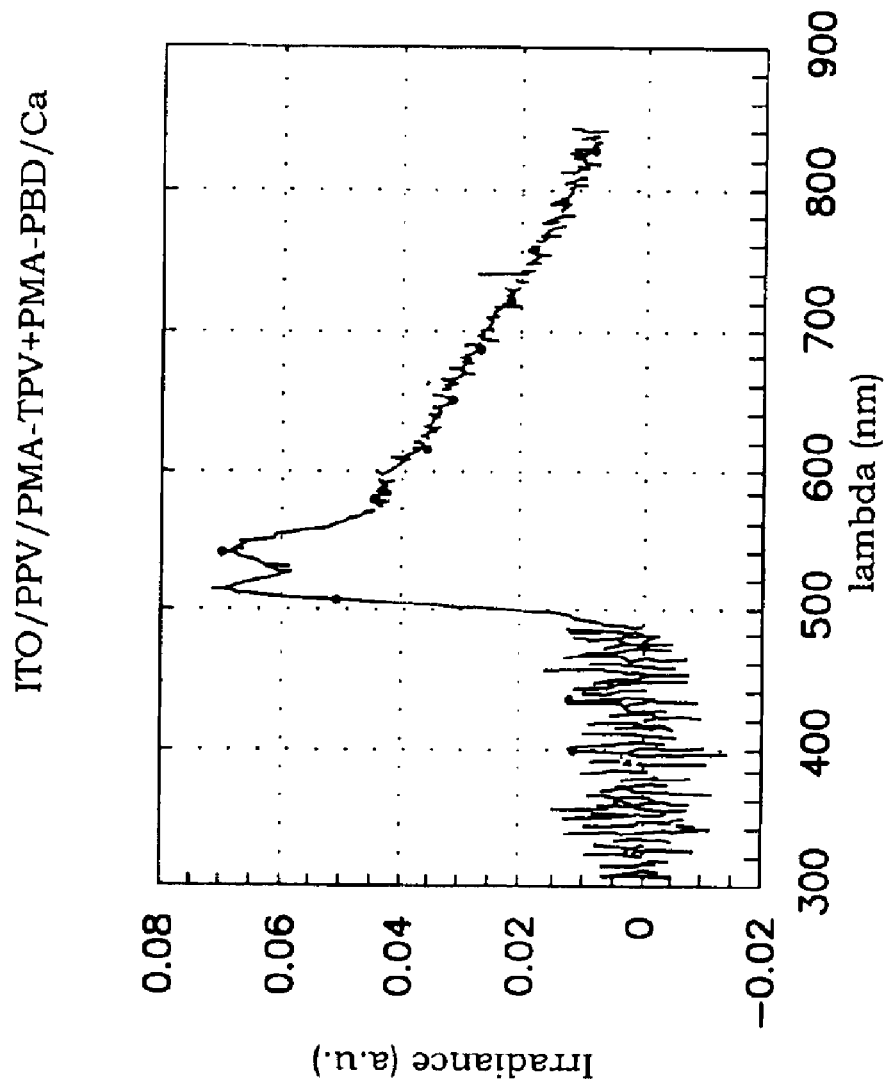
FIG. 5 shows a graph of luminance against wavelength lambda for the device ITO/PPV/PMA-TPV+PMA-PBD/Ca.

Blue light emission was observed at a bias voltage of 20V in the first 30 minutes followed by a continuous green light emission(FIG. 5). The PMA-PBD polymer is used as an electron-transporting functional layer, while the PMA-TPV polymer was used to produce blue light emission. The PMA-TPV polymer also exhibits some cross-linking potential.

EXAMPLE 16

Poly(methacrylate) PBD-TPV Copolymer Used as a Blue Light Emitting Layer, in a Double Layer Device:

In an series of LED devices, it has been found that incorporation of PMA-PBD showed no benefit in enhancing light-emission from a PPV or PMA-TPV layer, when aluminium was used as the cathode [devices (9) and (10)]. However, PBD segments in the copolymer PMA-TPV-PBD does enhance or aid blue light emission from the TPV chromophores in the copolymer [as shown in device (13)].

| | |
|---|---|
| (9) ITO/PPV/Al | No light emission |
| (10) ITO/PPV/PMA-PBD/Al | No light emission |
| (11) ITO/PPV/PMA-TPV/Al | No light emission |
| (12) ITO/PPV/Blend of PMA-TPV + PMA-PBD/Al | Blue light emission but less stable |
| (13) ITO/PPV/Copolymer of PMA-TPV-PBD/Al | Blue light emission |

Figure 6:
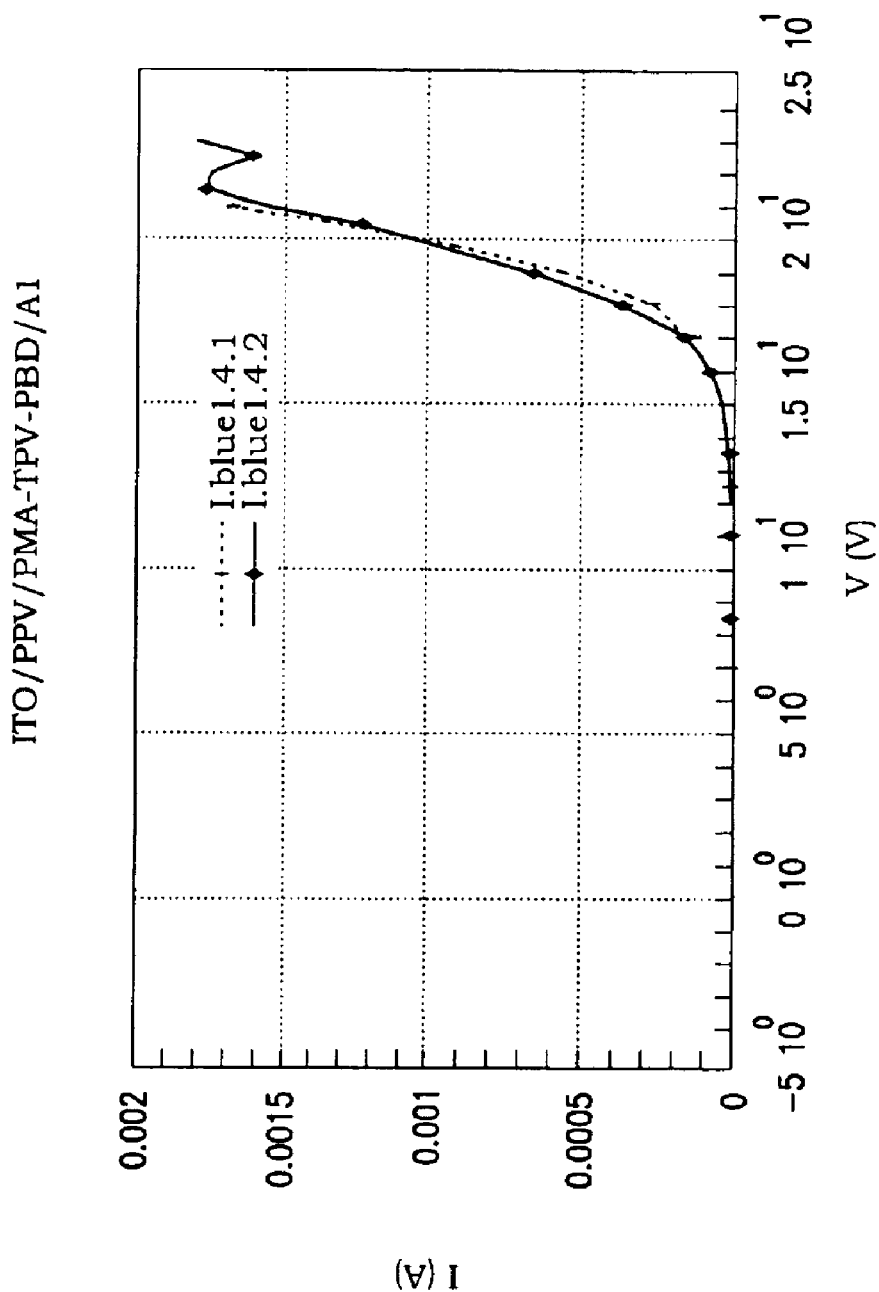
FIG. 6 shows a graph of current against voltage for the device ITO/PPV/PMA-TPV-PBD/Al.
Figure 7:
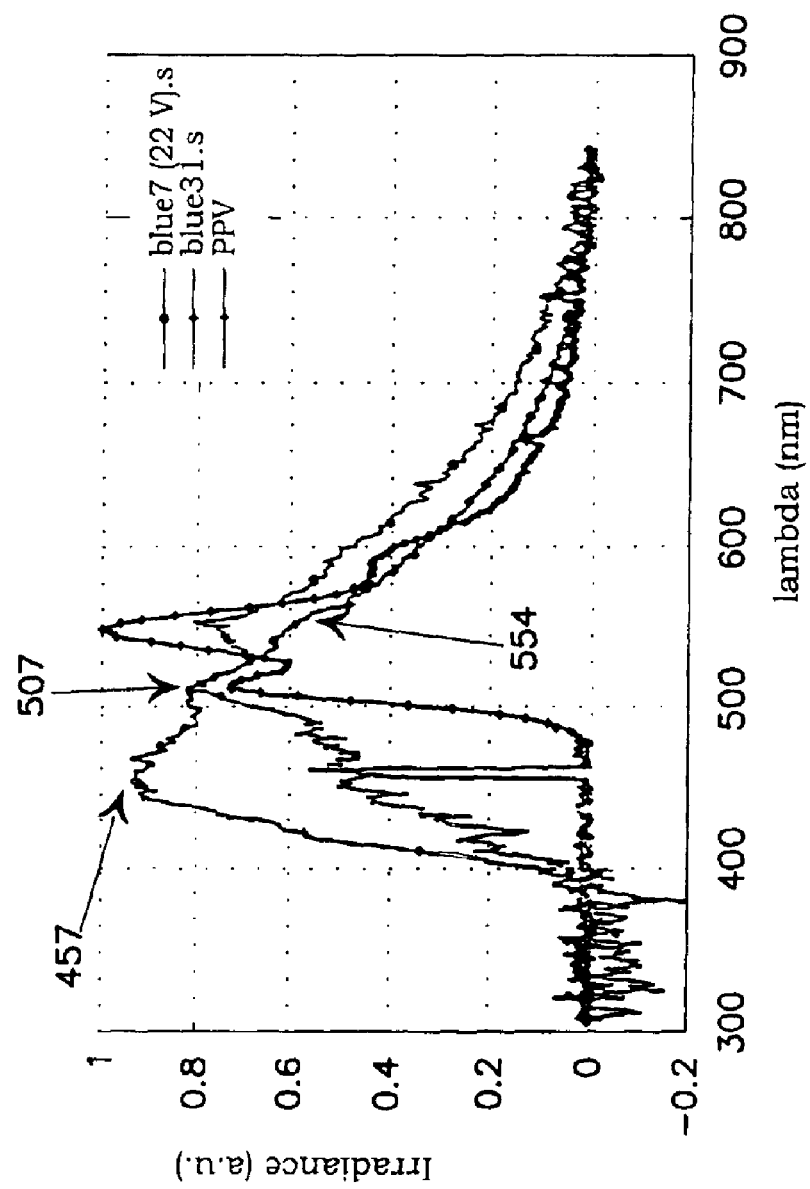
FIG. 7 shows a graph of luminance against wavelength lambda for various LED devices ITO/PPV/Ca, ITO/PPV/Copolymer of 16 and 9b (1:1)/Al indicating cross-linking of the distyrlbenzene chromophore as a function of time.
Figure 8:
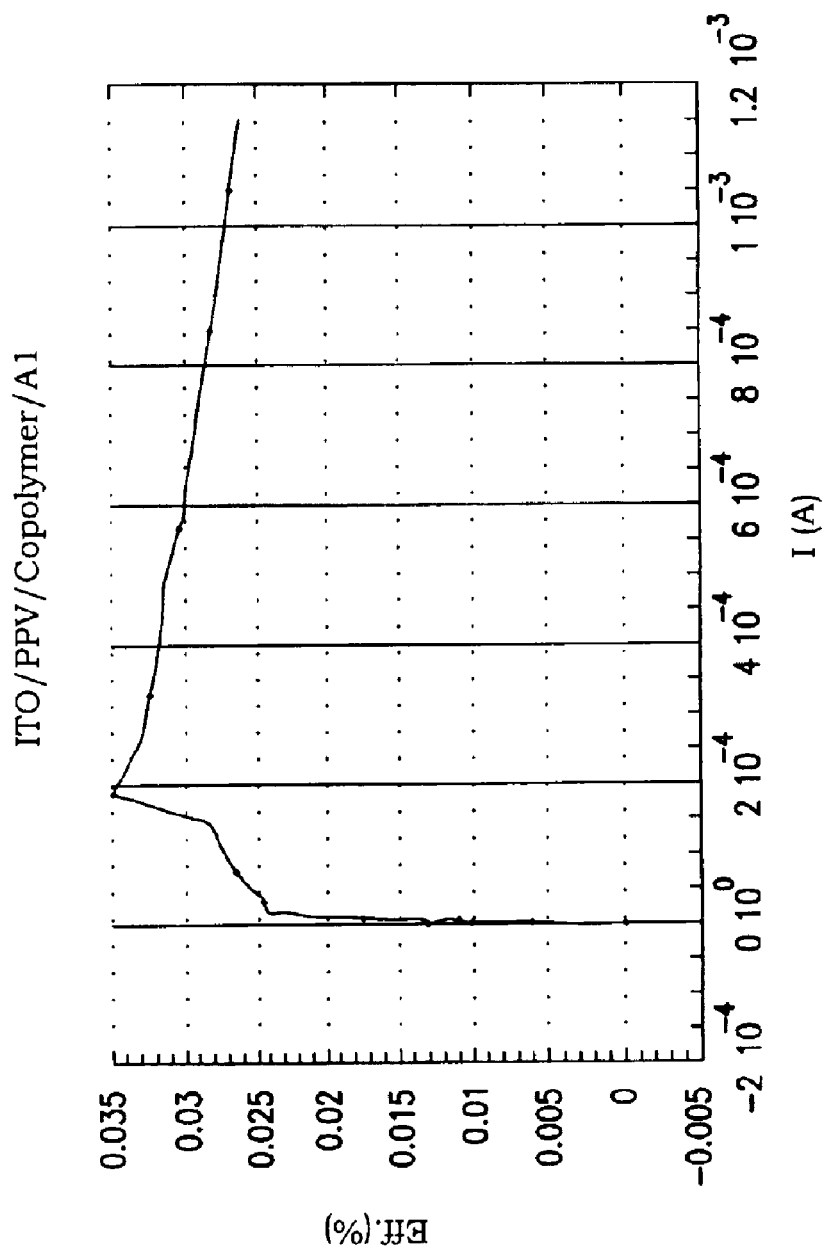
FIG. 8 shows a graph of efficiency against current for the device ITO/PPV/copolymer/Al of FIG. 7.
Figure 9:
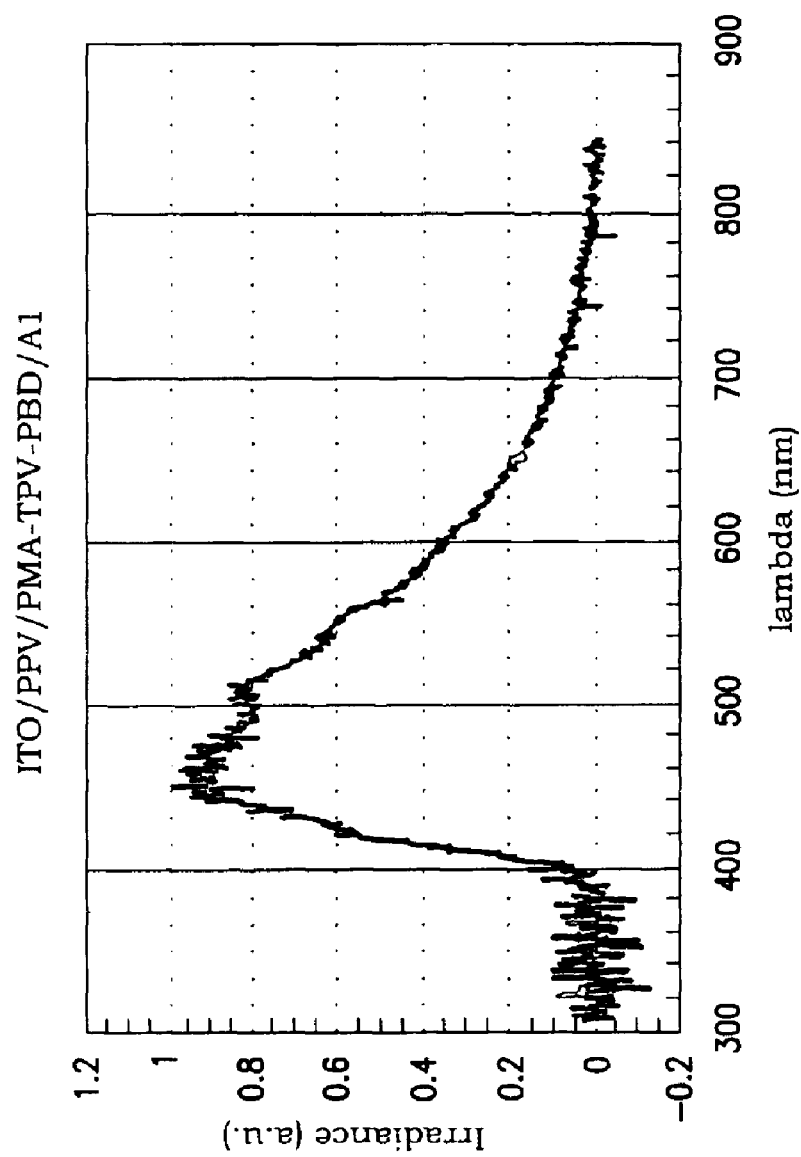
FIG. 9 shows a graph of luminance against wavelength lambda for the copolymer device of FIG. 7.
Figure 10:
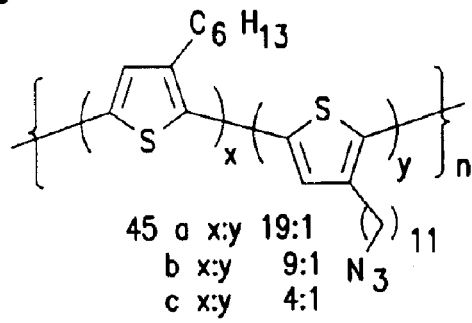
FIG. 10 illustrates representative polythiophenes for cross-linking.

These results suggest that the use of electron transporting segments in the copolymer is better than that in the form of a blend [compare device (12) with (13) and (14)]. FIG. 6 shows that the turn-on voltage for the device is about 16V, and the light intensity will increase along with the increase of the applied voltage until 23V(device break-down occurs beyond that voltage)(FIG. 6). It can be seen from FIG. 7, that the colour of the light emitted is blue since the peak maxima in the electroluminescence spectrum is located at 457 nm. This is in the blue region of the visible spectrum. It can also be seen from FIG. 8 (line 2), that there is light emission from the PPV layer since there are two electroluminescent shoulders at 554 nm and 507 nm, which are typical of PPV emission (FIG. 8 (line 3)]. The PPV emission is further confirmed when the colour of light emitted gradually changes from blue to green on continuous charge application. This suggest the break-down of the TPV chromophores in the PMA-TPV-PBD copolymer, thus leaving PPV as the sole light-emitting polymer. FIG. 9 shows that the device has a fairly high internal quantum efficiency (with 0.035%) considering aluminium is used as the cathode.

EXAMPLE 17
Copolymer PMA-TPV-PBD used as a Blue Light Emitting Layer in a Single Layer Device:

The copolymer solution(2% in chloroform) was directly spin-coated onto a clean ITO glass substrate followed by the deposition of aluminium to form a single layer LED device:

| | |
|---|---|
| (14) ITO/PMA-TPV-PBD/Al | Blue light emission |

Blue light emission was observed when a bias voltage (20V) was applied but the device appears to be less stable compared to the double layered LED device (13).

The Preparation and Application of Main Chain LED Polymers Through a Precursor Route Poly(methacrylates) have many advantages such as high transparency, high resistance to chemicals and good mechanical strength. High molecular weight poly (methacrylates) as well as multi-functional copolymers can also be easily obtained. However, poly(methacrylate) derivatives may not be good candidates for polymers which exhibit high stability and resistance to an electrical field. Therefore, they may have a life-time problem in applications involving LED devices. In order to prevent this problem, one approach involves the introduction of another chain segment which contains cross-linkable groups such as TPV. Another way to improve the resistance to an electrical field is to choose other types of polymer chains such as rigid-rod polymers or ladder polymers. However, there is a severe processability problem for rigid-rod or ladder polymers due to their low solubility in conventional organic solvents. The processability of these polymers can be improved by using a soluble precursor which can be converted to a rigid and conjugated polymer. Here, we have tried a precursor route for the synthesis of polyaromatic oxadiazoles as shown in Scheme 8 and Scheme 9.

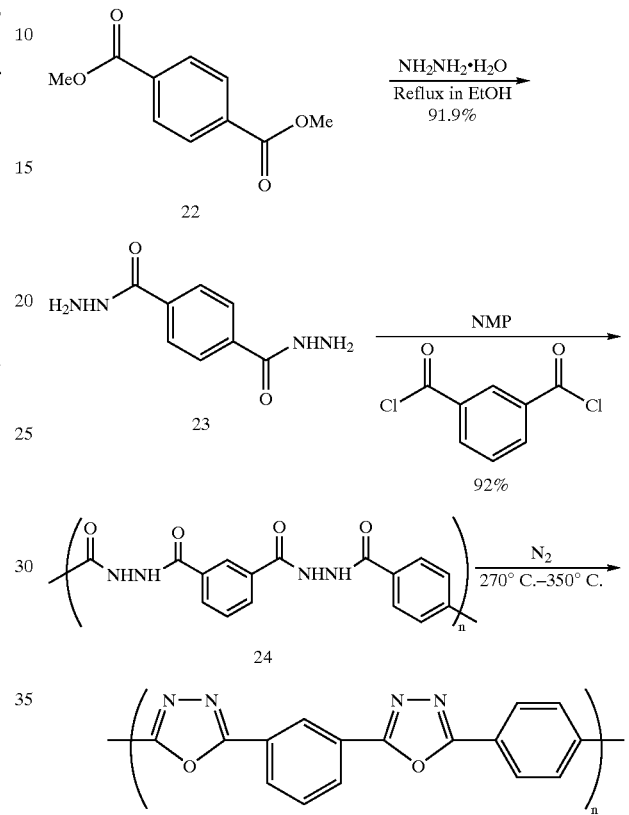

Scheme 8:
Precursor route for the synthesis of an aromatic oxadiazole polymer

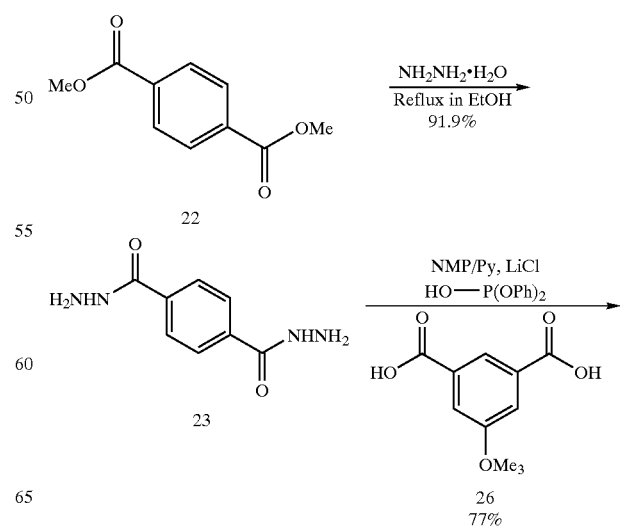

Scheme 9:
A Precursor route for the synthesis of a $^t$Bu- aromatic oxadiazole polymer -continued

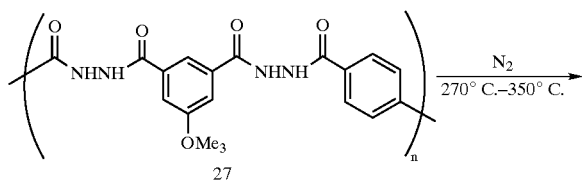

27

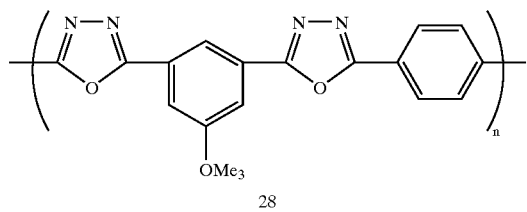

28

EXAMPLE 18

Synthesis of Polyaromatic hydrazide (24): 1,3-isophthaloyl dichloride(5.31 g, 26.17 mmol) was added to the slurry of (23) (5.08 g, 26.17 mmol) in N-methylpyrolidone(NMP) (50 ml) and LiCl (4.86 g) in a 250 ml, 3-neck RB flask. The reaction was stirred for 5 h at 0° C. before pouring the viscous reaction mixture into water to obtain a white precipitate which was then washed with 10% LiOH(aq) solution, water and methanol respectively. The polymer was purified by Soxhlet extraction using methanol(8 h) and dried in vacuo at 110° C. for 8 h. (24) was obtained as a white powdery solid(7.82 g, 92%). $\delta_H$ (200 MHz, DMSO-d$_6$) 7.73(1H, s), 8.15(2H, d, Ar—H), 8.09(4H, s), 8.52(1H, s, Ar—H), 10.77(4H, s, 2×NHNH); $\delta_C$ (100 MHz, DMSO-d$_6$) 127.2, 128.5, 130.0, 131.4, 133.0, 135.5 (Ar), 165.3C=O), 165.5(C=O); $v_{max}$ (KBr)/cm$^{-1}$ 3252 (N—H), 1685(C=O), 1654(CO—NH), 1560, 1508, 1488 (Ar); Intrinsic visicosity: 0.5 dL/g (30° C. in DMSO).

EXAMPLE 19

Preparation of polyaromatic oxadiazole (25): The polyaromatic hydrazide (24) will be thermally converted to (25) at 270° C. (or above) under nitrogen or in vacuo for at least 24 h. $v_{max}$ (KBr)/cm$^{-1}$: 1700 (residue of CO—NH), 1609, 1543, 1478, 1458(Ar), 961(oxadiazole); $\lambda_{max/film}$: 227, 335 nm.

EXAMPLE 20

Preparation of polyaromatic hydrazide-tert-Bu (27): A 250 ml 3-neck RB flask with a condensor, a mechanic stirrer and thermometer was charged with (23) (3.88 g, 0.02 mol), 5-tert-butyl-1,3-isophthalic acid (26) (4.44 g, 0.02 mol), and LiCl (6.0 g) dissolved in dry NMP(60 ml) and dry pyridine (40 ml). The reaction was carried out in the presence of diphenyl phosphite (14.05 g, 60 mmol) at 120° C. for 2.5 h. The sticky, opaque solution was poured into methanol(500 ml) to obtain a white precipitate which was then washed with methanol(4×200 ml) and then, extracted using methanol in a Soxhlet apparatus for 20 h. After drying in vacuo, (27) was obtained as a white solid (5.85 g, 77%). $\delta_H$ (200 MHz, DMO-d$_6$) 1.43(9H, s, C(CH$_3$)$_3$), 8.10(4H, b), 8.20 (2H, b), 8.37(1H, Ar—H), 10.77, 10.80(4H, 2, 2×NHNH); $\delta_C$ (100 MHz, DMSO-d$_6$) 31.0(C(CH$_3$)$_3$), 35.1(CMe$_3$), 122.1, 124.8, 127.9, 132.9, 135.6, 151.8(Ar), 165.3(C=O), 165.7(C=O); $v_{max}$ (KBr)/cm 3252(CO—N—H), 2957(C—H), 1654(CO—NH), 1543, 1478(Ar); [Found: C, 60.60; H, 5.64; N, 14.47. C$_{20}$H$_{20}$N$_4$O$_4$ requires: C, 63.13; H, 5.30; N, 14.47%].

EXAMPLE 21

Preparation of polyaromatic oxadiazole-tert-Bu (28): The polyaromatic hydrazide-$^t$Bu polymer (27) was thermally converted into polymer (28) under nitrogen or in vacuo at 270° C. (or above) for at least 24 h. $v_{max}$ (KBr)/cm$^{-1}$ 2957(C—H), 1543 s, 1482(Ar), 962(oxadiazole); [Found: C, 68.64; H, 4.65; N, 15.64. C$_{20}$H$_{16}$N$_4$O$_2$ requires: C, 68.54; H, 4.69; N, 16.28%].

The Preparation and Application of Main Chain Polymers Through the Introduction of Flexible Spacers The introduction of a flexible spacer into a conjugated or rigid polymer chain will usually enhance the solubility of the polymer. The following examples illustrate the preparation and application of three different polymers with a hexafluoropropylene spacer. (Scheme 10).

EXAMPLE 22

Preparation of Poly(phenylene-1,3,4-oxadiazole-2,5-diylphenylene-2,2-hexafluoropropylidene) (31): Phosphorus pentoxide (2.95 g, 20.0 mmol) was dissolved in methanesulfonic acid (20 ml) upon stirring at 80° C. over 30 min. Hydrazine sulfate (1.302 g, 10.0 mmol) and 2,2-bis(4-carboxyphenyl)hexafluoropropane (29) (3.923 g, 10.0 mmol) were added and the mixture stirred for 24 h at 80° C. The solids dissolved slowly within 30 min. On cooling to room temperature, the yellow viscous solution was poured into water (300 ml) and neutralised with saturated aqueous Na$_2$CO$_3$ (40 ml). The precipitate(fibre-like) was filtered out under suction and washed with water (3×300 ml), and finally purified by dissolving in chloroform and precipitating out in methanol(repeated three times). (31) was obtained as grey-white fibres which melted/decomposed above 270° C. (2.79 g, 75.4%). $\lambda_{max}$ (chloroform) 300 nm; $\lambda_{max}$ (solid film) 290 nm; $v_{max}$ (KBr)/cm$^{-1}$ 1618, 1585, 1551, 1499, 1420, 1256, 1210, 1175, 1140, 1071 10120, 971, 928, 840 723; $\delta_H$ (400 MHz, CDCl$_3$) 7.60–8.18 (8H, b, Ar—H); $\delta_C$ (100 MHz, CDCl$_3$) 122.3, 124.8, 125.3(ipso-C), 127.1 and 131.0 (CH), 136.5(ipso-C); [Found: C, 54.99; H, 2.29; N, 7.56. C$_{17}$H$_8$F$_6$N$_2$O requires: C, 55.15; H, 2.18; N, 7.57%]; The polymer was insoluble in ethyl acetate, ether, acetonitrile, toluene and acetone but soluble in tetrahydrofuran, dichloromethane and chloroform. GPC assay revealed (CHCl$_3$, polystyrene as standard, 10 ml/min flow rate) M$_n$=11,800, M$_w$=143,000, M$_w$/M$_n$=12.

Scheme 10:
The synthesis of fluoroine-containing polyaromatic oxadiazoles

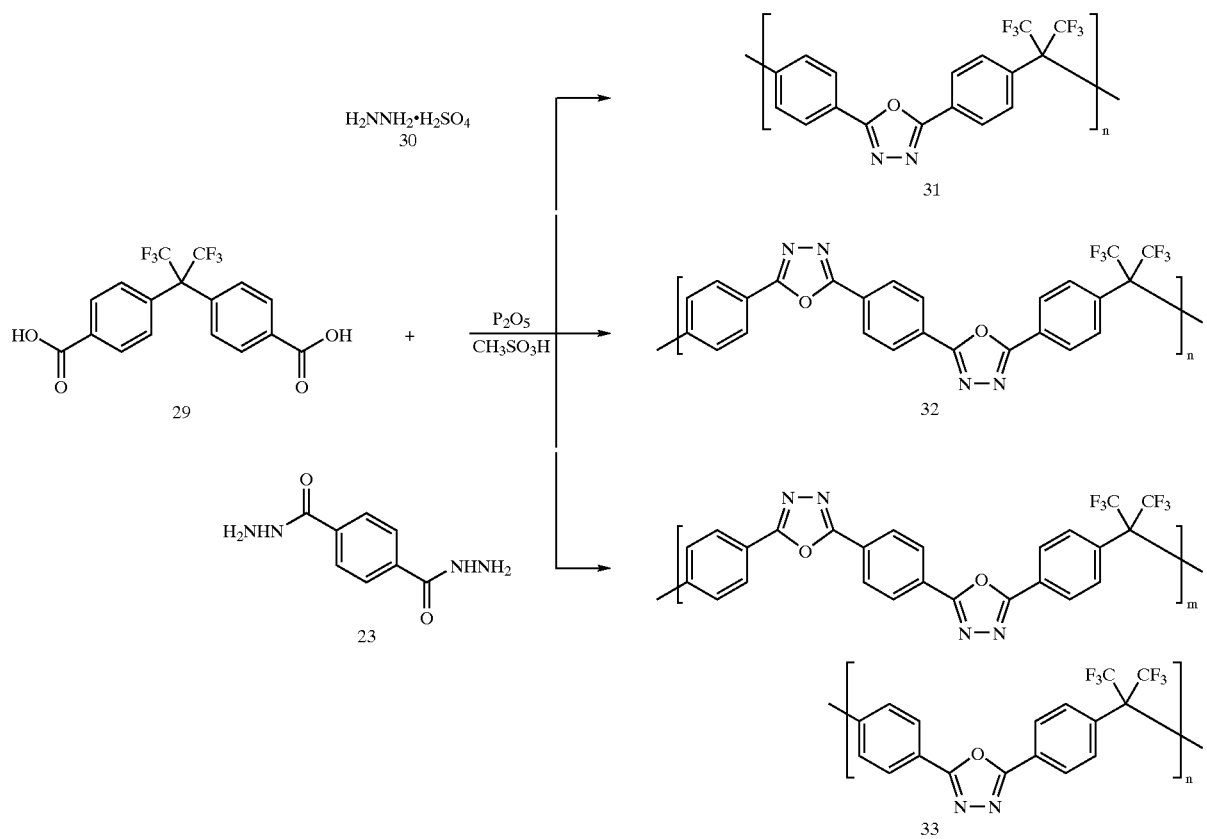

EXAMPLE 23
The Preparation of Polymer (32):

The synthesis procedure for polymer (32) is quite similar to that of polymer (31). Phosphorus pentoxide (2.70 g) was dissolved in methanesulfonic acid (16.0 ml) upon stirring at 80° C. over 30 min. Hydrazide (23) (1.6355 g, 8.42 mmol) and 2,2-bis(4-carboxyphenyl) hexafluoropropane (29) (3.301 g, 8.42 mmol) were added and the mixture stirred for 24 h at 80° C. After the mixture was cooled to room temperature, the yellow viscous solution was poured into water (300 ml) and neutralised with saturated aqueous $Na_2CO_3$ (40 ml). The precipitate was filtered out under suction and washed with water (3×300 ml), and finally purified by Soxhlet extraction with methanol for 48 h. (32) was obtained as a grey powdery solid which melted/decomposed above 270° C. (3.43 g, 79.2%). $\lambda_{max}$ (solid film) 312 nm. $\nu_{max}$ (KBr)/cm$^{-1}$ 1725, 1617, 1576, 1552, 1497, 1415, 1327, 1256, 1210, 1174, 1140, 1072, 1017s, 970, 928, 838, 722; $\delta_H$ (400 MHz, CDCl$_3$) 7.43(4H, s, Ar—H), 7.64(4H, s, Ar—H), 7.85(4H, s, Ar—H); $\delta_C$ (100 MHz, CDCl$_3$) 123.8, 124.3 127.2, 127.8, 129.8, 130.8, 133.0, 133.8, 141.6.

EXAMPLE 24
The Preparation of Polymer (33)

The synthesis procedure or polymer (33) is quite similar to that of polymer (31). Phosphorus pentoxide (1.860 g) was dissolved in methanesulfonic acid (12.0 ml) upon stirring at 80° C. over 30 min. Hydrazide (23) (0.611 g, 3.148 mmol), hydrazine sulfate(0.410 g, 3.148 mmol) and 2,2-bis(4-carboxyphenyl)hexafluoropropane (29) (2.47 g, 6.30 mmol) were added and the mixture stirred for 24 h at 80° C. After the mixture had cooled down to room temperature, the yellow viscous solution was poured into water (300 ml) and neutralised with saturated aqueous $Na_2CO_3$ (40 ml). The precipitate was collected by suction filtration and washed with water (3×300 ml), and finally purified by Soxhlet extraction with methanol for 48 h. (33) was obtained as a grey powdery solid which melted/decomposed above 270° C. (2.54 g, 91.4%). $\lambda_{max}$ (solid film) 320 nm. $\delta_H$ (250 MHz, CDCl$_3$) 7.41(4H, s, Ar—H), 7.90(4H, s, Ar—H), 8.13(2H, s, Ar—H); $\delta_C$ (100 MHz, CDCl$_3$) 124.2, 124.4, 125.0, 127.8, 128.5(C), 130.4, 131.5, 134.5(CH), 142.3(C).

EXAMPLE 25
Polymer (31) as a Single Electron Transport Layer

Clear polymer (31) solution(1% in chloroform, filtrated through 0.45 μl membrane) was spin-coated onto a PPV layer(ca. 40 nm thickness on an ITO glass substrate). Aluminium was then evaporated on top of the film of polymer (31) (ca. 40 nm) to form a double layer polymer LED device (ITO/PPV/P-31/Al]. A more stable green light emission was obtained at a bias voltage of 22V, in comparision to a device without P-31.

EXAMPLE 26
Polymer (31) as Electron Transporting Polymer in a Blend Form with Polyalkylthiophene A clear blend of polymer solution(1% in chloroform, filtrated through 0.45 ul membrane) [1:1 ratio of polymer- (31):poly(3-(2-dimethyl ethyl)thiophene)] was spin-coated onto a dry and clean ITO glass substrate. Aluminium was then evaporated on top of the film of polymer blend (ca. 40 nm) to form a double layer polymer LED device: [ITO/PAT+P-31/Al]. A more stable yellow light emission was obtained at a bias voltage of 18V, in comparision to a device without P-31.

EXAMPLE 27
Polymer (32) as Both an Electron Transporting Polymer and Electroluminescent Polymer in a Double Layer Device A clear solution of polymer (32) (1% in trifluoroacetic acid, filtered through 0.6 ul pore size membrane) was spin-coated onto a PPV layer(ca. 40 nm thickness on an ITO glass substrate). Aluminium was then evaporated on too of the film of polymer (32) (ca. 40 nm) to form a double layer polymer LED device: [ITO/PPV/P-32/Al]. Green light emission was observed at a bias voltage of 15V, which then turned to blue purple when a higher bias voltage(28V) was applied.

The Synthesis of Polythiophenes 45a–c

The synthesis of the relevant polythiophenes 45a–c is shown in Scheme 11

The relevant thiophene monomers 1 and 2 have been reported (K. A. Murray, S. C. Moratti, D. R. Baigent, N. C. Greenham, K. Pichler, A. B. Holmes and R. H. Friend, *Synth. Met.*, 1995, 69, 395–396).

The regioregular polythiophenes chosen to illustrate crosslinkable polymers are poly(3-hexylthiophene)s containing a small amount of 11-hydroxyundecyl side chains. The monomers have been copolymerised in ratios of 19:1 1:2 up to 2:1 1:2, to give the tetrahydropyranyl acetal protected copolymers 43. These can be deprotected to give the alcohol-functionalised copolymers 44 (scheme 11). Conversion to the azide is achieved in one step using excess dphenylphosphoryl azide and has been carried out on 19:1, 9:1 and 4:1 ratio copolymers 44 to give azidated copolymers 45a, 45b and 45c respectively; no residual alcohol can be seen by $^1$H NMR.

Figure 11:
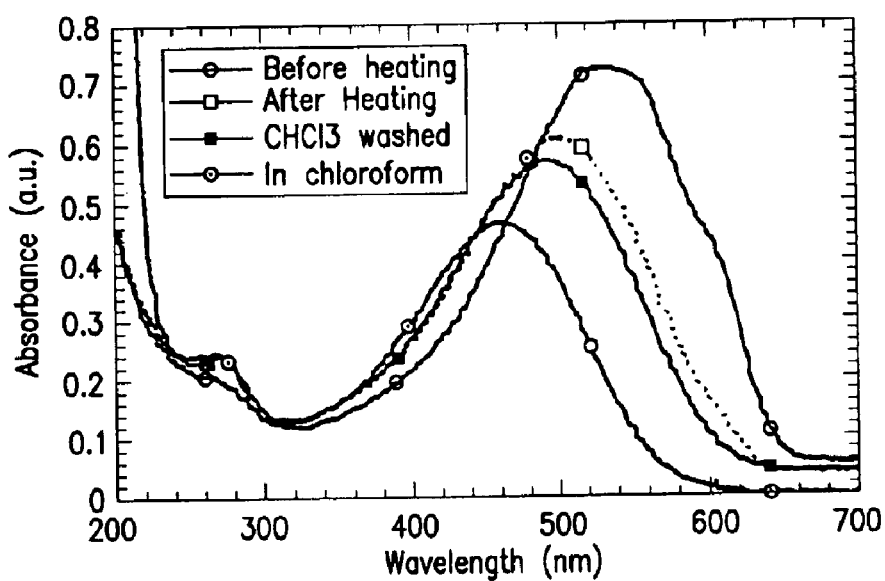
FIG. 11 shows cross-linking of a 9:1 copolymer 45b before and after heating.
Figure 12:
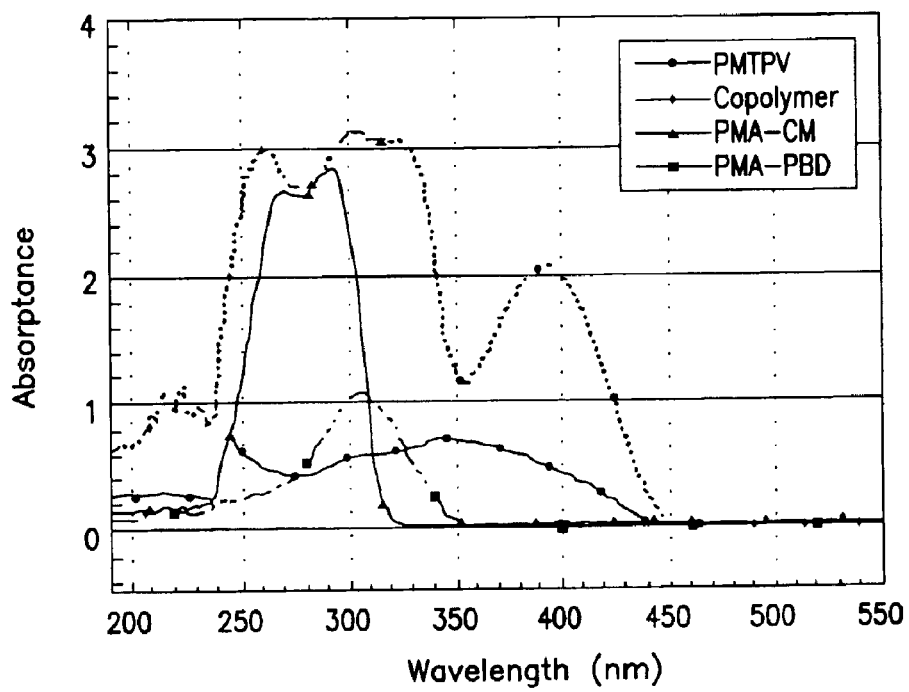
FIG. 12 shows a graph of a UV-VIS absorption spectrum of copolymer 49.
Figure 13:
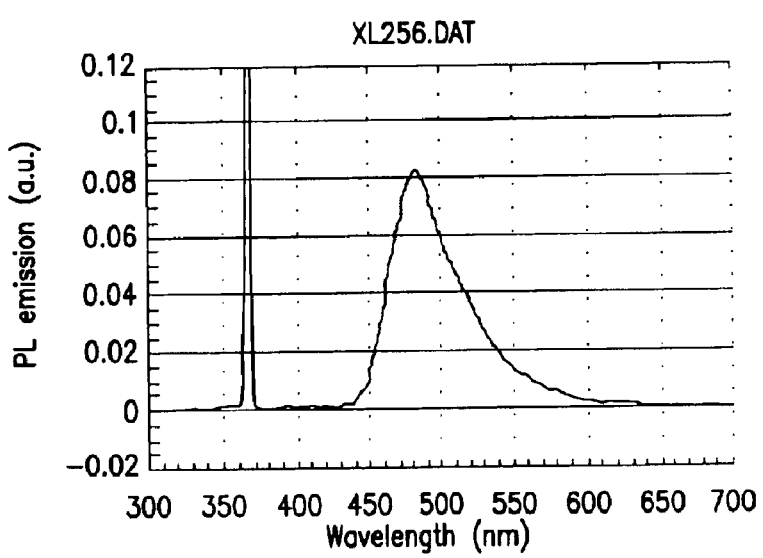
FIG. 13 shows a photoluminescence spectrum of polymethacrylate 49 (p=0.5, q=0.3, r=0.2) with three functional groups.

Thermal decomposition of the azide was achieved by heating films of polymers 45a–c to 200° C. under vacuum for 30 minutes; differential scanning calorimetry of polymer 45b indicates that azide decomposition occurs above 185° C. Azide decomposition results in loss of nitrogen and the formation of a highly reactive nitrene which is expected to react fairly indiscriminately with single and double bonds. A change in the UV-visible absorption spectra of the polymers is observed on crosslinking; the spectrum shifts to lower wavelength (higher energy) possibly due to a shorter conjugation length due to nitrene insertion along the polymer backbone and this effect increases with the azide content of the polymer (FIG. 11, Table 1). The resulting films were washed with chloroform and were insoluble but showed a slight colour change (Table 1). A small amount of soluble, non-crosslinked polymer was washed from the 19:1 copolymer (ex 45a) but the remaining polymer was fully insoluble.

TABLE 1

Thermal crosslinking of regioregular polythiophenes with different azide contents.

| Polymer | Ratio hexyl:azide | $\lambda_{max}$/nm before heat | $\lambda_{max}$/nm after heat | $\lambda_{max}$\nm CHCl$_3$ washed | $\lambda_{max}$/nm in chloroform |
|---|---|---|---|---|---|
| 45a | 19:1 | 520 | 510 | 502 | 458 |
| 45b | 9:1 | 522 | 496 | 488 | 458 |
| 45c | 4:1 | 522 | 486 | 482 | 462 |

The resultant insoluble polythiophene films can be used in device formation, as further layers might be spun from solution on top of the polythiophene without causing any damage. It is also possible that physical properties could be tailored by altering the azide concentration and controlling the conjugation length in the polymer.

Figure 16:
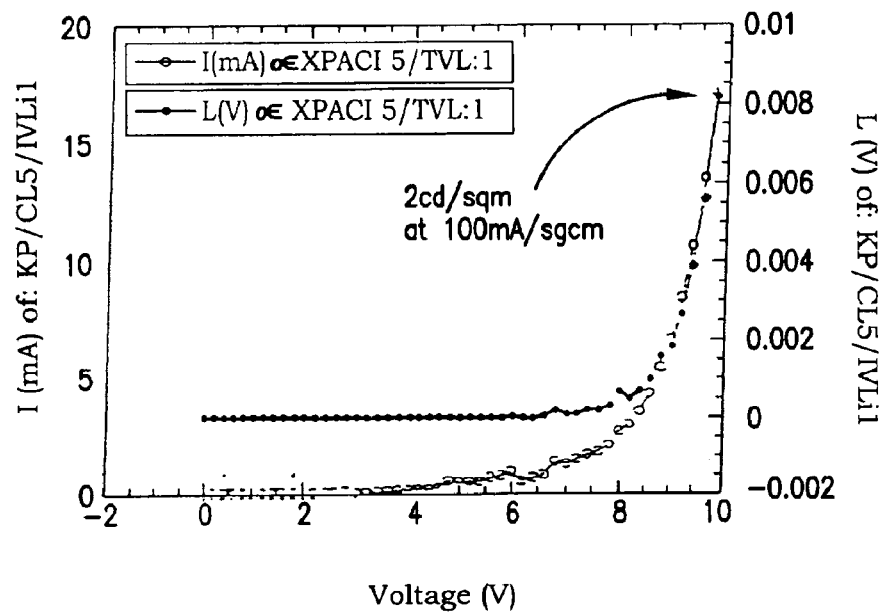
FIG. 16 shows graphs of current and luminance against voltage for a cross-linked polythiophene (45b, 9:1) device.
Figure 17:
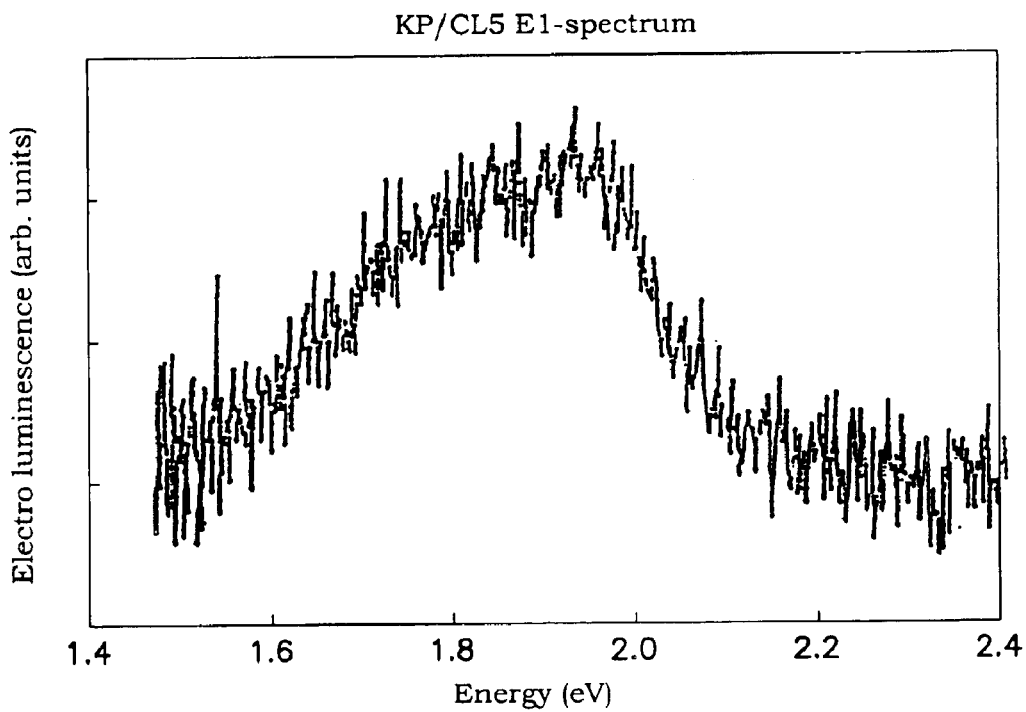
FIG. 17 shows an electroluminescent spectrum of a cross-linked thiophene device of FIG. 16.

Polythiophene Device Embodiment:

A film of the non-cross linked polythiophene was spun (1000 rpm/40 sec) on a ITO coated glass substrate producing a dark red uniform film. The substrate is baked at 200° C. for 60 minutes in vacuum (5 10$^{-6}$ mbar). After cooling the film was carefully washed with chloroform and dried in nitrogen. 1000 A of aluminium is evaporated onto the polymer to form the top contact. Finally the device was encapsulated with an epoxy/glass combination. FIG. 16 shows a typical IV and LI curve. 2 cd/sqm emission was observed at about 100 mA/sqcm with 10V drive. The emission is red and the emission spectrum is shown in FIG. 17.

In a further embodiment of this invention the UV/VIS properties of the crosslinked polymers are retained and show response to the solvent environment without dissolving significantly. The solid films of the crosslinked polymers are all red, but are orange in contact with chloroform or other good solvents (toluene, THF), indicating salvation of the polymers. The absorption spectra for the 9:1 copolymer (45b) are shown (FIG. 11). This property serves the function of allowing these polymer films to be used in detection and sensing devices on account of their change in optical properties. Changes in chiroptical properties could also be detected in crosslinked polythiophenes carrying chirally modified side chains. In this way, optical devices can be made which would function as sensors or chiral thin film affinity surfaces for detection of various substrates, such as enantiomers, peptides, proteins and enzymes.

Crosslinked Cinnamate Ester Derivatives

Poly(methacrylate) polymers 49 (Scheme 12) carrying statistical oxadiazole side chains, with distyrylbenzene and cinnamate side chains have been cross linked by photochemical irradiation. The resulting polymer in a light emitting device emits light blue light efficiently.

Poly(methacrylates) have many advantages such as high transparency, high resistance to chemicals, and good mechanical strength. It is also relatively easy to synthesise high molecular weight polymers as well as multi-functional copolymers. A range of aromatic oxadiazole bonded polymers, distyrylbenzene bonded polymers, and the copolymers bonded with both oxadiazole and distyrylbenzene have been synthesised and used for electron transporting layer or light emitting layer. However, the device of these polymers tend not to be very stable while working, presumably due to she flexible backbone and easy dimerisation between different distyrylbenzene. In order to overcome this problem, another functional unit that is UV-photosensitivity crosslinkable, has been copolymerised to achieve polymethacrylate with electron transporting unit, blue light emitting unit and UV-crosslinkable unit. Better device stability will be expected as the result of cross linking and therefore suppress polymer chain movement and dimerisation.

The UV-sensitive 2-(cinnamoyloxy) ethyl methacrylate 47 was synthesised according to the literature [M. Kato, T. Hirayama, *Macromol.Rapid.Commun.*, 1994, 15, 741). Monomer 47 can be readily polymerised in the initiating of AIBN. It was found when benzene is used as solvent, large majority of the formed polymer is insoluble in common organic solvent, indicating the cross link reaction has been simultaneously resulted during polymerisation. When the polymerisation is carried out in THF, fully soluble polymer can be obtained at 60° C. for 8 hours. The solvent THF obviously not only plays a solubilising role, but also controls the reactivity of radical species.

The copolymerisation of the aromatic oxadiazole unit 46, distyrylbenzene unit 48 and the monomer 47 was carried out under a similar conditions for the homopolymer. The ratio among the monomers can be varied. For convenience, equal weights of the monomers have been used for the copolymerisation that corresponds to p=0.53, q=0.28 and r=0.19 (Scheme 12). Yellow powdery copolymer 49 can be obtained in good yield after purification (precipitate twice in methanol). The copolymer 49 is soluble in chlorinated solvents, THF and toluene but insoluble in hexane, methanol. GPC analysis revealed that the molar mass of 49 is 11,200/53,500 ($M_n/M_w$). Free standing polymer film can be easily obtained by casting technique. The polymer has good stability if it is kept in the refrigerator at <0° C.

The polymer 49 fluoresces greenish blue under UV light.

The Photocrosslinking Behaviour of the Copolymer 49

Figure 14:
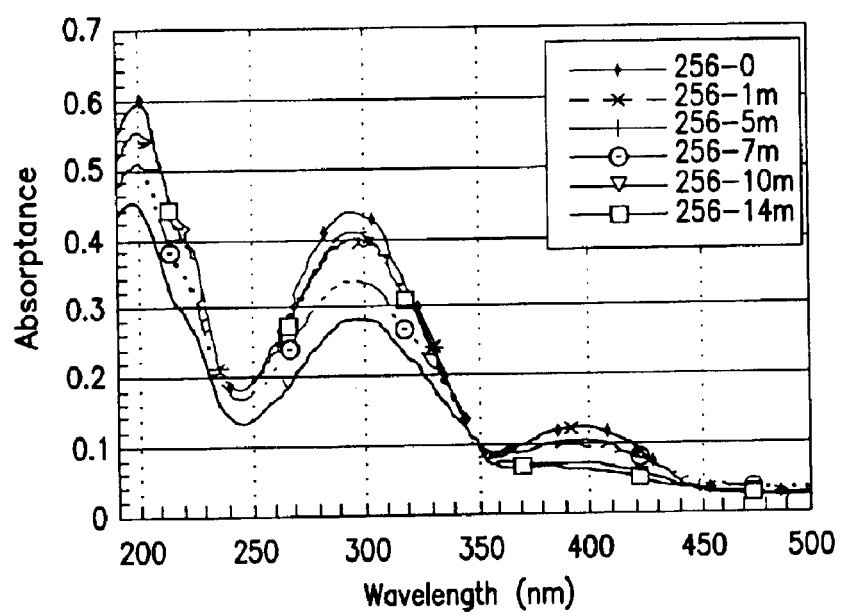
FIG. 14 shows a UV-VIS absorption spectrum of the 3-unite copolymer of FIG. 13 upon exposure to UV light as a function of time.

The three unit copolymer contains not only a luminophore and an electron transporting chromophore, but also a UV-sensitive cross linking unit. In order to understand the photocrosslinking behaviour of the polymer, a thin film of the polymer was exposed in UV-light for various time. It can be seen from FIG. 14 that the copolymer exhibits 3 absorption peaks in the solid state at 200 nm, 295 nm and 400 nm. With increasing exposure time, the intensity of these 3 peaks decreased. The peaks at 295 nm and 200 nm are related to the cinnamoyloxy group which will be decreased as the result of cross linking. The effect on the IR absorption of the cinnamoyl ester carboxyl group is seen in Table 2. When a film polymer 49 (on a glass plate) was exposed for 5 minutes, the film became insoluble in chloroform but still fluoresced blue. Therefore, 5–10 minutes exposure time was appropriate for obtaining a cross linked and insoluble polymer. The PL spectrum of the resulting cross-linked polymer film showed little change upon further irradiation and maintained constant luminescence efficiency (39%).

TABLE 2

The change of ester group infrared absorption with UV exposure time

| Time/m | 0 | 1 | 6 | 16 | 26 | 40 | 60 | 80 | 110 |
|---|---|---|---|---|---|---|---|---|---|
| IR peak (cm-1) | 1722 | 1722 | 1723 | 1724 | 1725 | 1727 | 1728 | 1729 | 1729 |

LED Application

Two LED devices have been fabricated using PPV as hole transporting layer and copolymer 49 with and without UV irradiation (5 minutes) as emissive layer:

A ITO/PPV/Polymer 49/Al: Pale blue emission (20 V/0.8 mA)

B) ITO/PPV/Polymer 49 irradiated/Al: Pale blue emission (28 V/0.8 mA)

The above results show that polymer 49 can be successfully used as a blue light emitting polymer using stable aluminium as cathode. Moreover, the spin-coated emissive polymer can be easily cured by UV irradiation to become insoluble which leads to crosslinked polymer and results in a more stable polymer LED.

Figure 15:
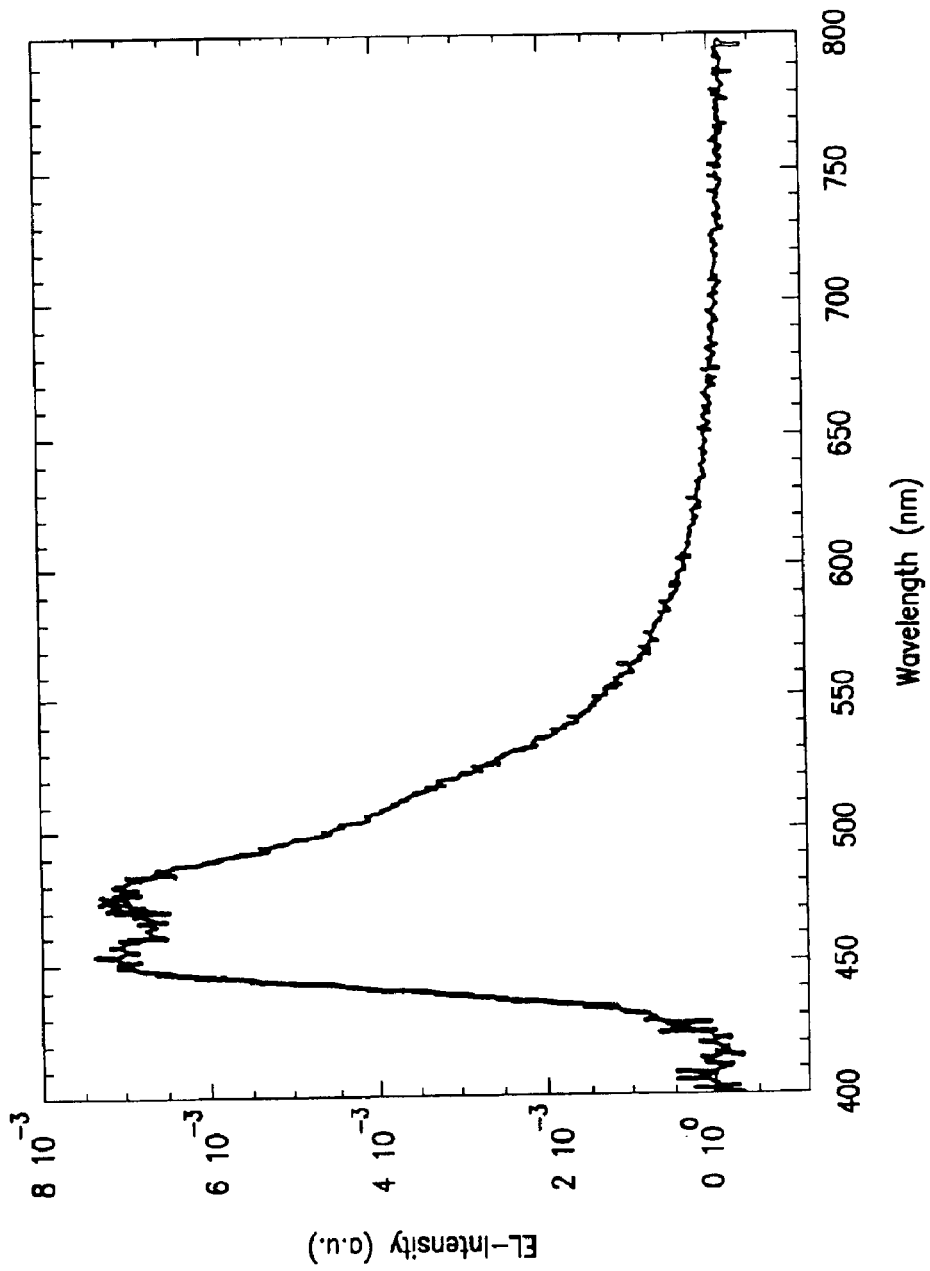
FIG. 15 shows an electroluminescent spectrum of a light emitting device using polymer 49 as an emissive layer (ITO/polymer 49/Ca, with internal quantum efficiency of 0.1%)

A single layer light emitting device using the polymer 49 as an emissive layer and calcium as cathode has also been made. Blue light emission has been observed with 0.1% internal quantum efficiency. For a single layer device, the quantum efficiency is relatively high. The electroluminescence spectrum of the single layer device using polymer 49 is shown in FIG. 15.

Representative Synthesis of Polymer 45b

Regioregular 9:1 Poly{3-hexyl-co-3-(11-[2-tetrahydropyranyloxy]undecyl)-thiophene} (43b)

Following the above procedure (for polymer 43a) a mixture of 2-bromo-3-hexylthiophene (41) (1.47 g, 5.95 mmol) and 2-bromo-3-(5-(2-tetrahydropyranyloxy]undecyl)-thiophene (42) (0.28 g, 0.67 mmol) was polymerised (with one addition of $NiCl_2$ (dppp) catalyst) to give copolymer 43b (108 mg, 9%) as a deep purple solid film. $\lambda_{max}$ ($CHCl_3$/nm) 450; $\delta_H$ (200 MHz, $CDCl_3$) 0.91 (t, J 6.4, 6'-H [3H] of hexyl), 1.20–1.80 (br m, side-chain $CH_2$), 2.81 (2H, br t, J 7.6, 1'-H), 3.31–3.54 (0.2H, m, 11', 6''-H [2H] of 11-THPO-undecyl), 3.66–3.90 (0.2H, m, 11', 6''-H [2H] of 11-THPO-undecyl) 4.57 (0.1H, m, 2''-H [1H] of 11-THPO-undecyl) and 6.98 (1H, s, 4-H); GPC ($CHCl_3$, 450 nm)/Da $M_n$ 9,5000, $M_w$ 13,400, polydispersity 1.42.

Regioregular 9:1 Poly{3-hexyl-co-3-(11-hydroxyundecyl) thiphene} (44b)

Following the above procedure (for polymer 44a), regioregular 9:1 poly{3-hexyl-co-(11-[2-tetrahydropyranyloxyundecyl)thiophene} (43b) (117 mg) was treated with methanol/dilute aqueous HCl to give deprotected copolymer 44b (104 mg, 93%) as a deep purple solid film. $\lambda_{max}$ (solid/nm) 526, 550 sh, 600 sh, ($CHCl_3$/nm) 450; $\delta_H$ (200 MHz, $CDCl_3$) 0.91 (br t, J-6.4, 6'-H [3H] of hexyl), 1.20–1.80 (br m, side-chain $CH_2$), 2.81 (2H, br t, J-7.5, 1'-H), 3.62 (0.2H, t, J 6.5, 11'-H [2H] of 11-hydroxyundecyl) and 6.98 (1H, s, 4-H); GPC ($CHCl_3$, 450 nm)/Da $M_n$ 11,500, $M_w$ 17,000, polydispersity 1.65.

Regioregular 9:1 Poly{3-hexyl-co-3-(11-azidoundecyl) thiophene} (45b)

Following the above procedure (for polymer 45a), regioregular 9:1 poly{3-hexyl-co-3-(11-hydroxyundecyl) thiophene} (44b) (77 mg) was azidated to give copolymer 45b (63 mg, 81%) as a deep purple solid film. $\lambda_{max}$ (KBr disc)/$cm^{-1}$ includes 2095 w (azide); $\lambda_{max}$ (solid/nm) 522, 550 sh, 600 sh, ($CHCl_3$/nm) 450; $\delta_H$ (200 MHz, $CDCl_3$) 0.91 (br t, J~6.7, 6'-H [3H] of hexyl), 1.20–1.80 (br m, side-chain $CH_2$), 2.81 (2H, br t, J~7.4, 1'-H), 3.23 (0.2H, t, J~7, 11'-H [2H] of 11-azidoundecyl) and 6.98 (1H, s, 4-H); GPC ($CHCl_3$, 450 nm)/Da $M_n$ 5,100, $M_w$ 11,800, polydispersity 2.34; DSC: exotherm at 185° C., max. at 200° C. (not seen on second sweep-nitrene formation); TGA (%/° C.) 99.5/185, 95.5/270, 55/480, <10/600 ($N_2$ loss=1.6%).

Scheme 11
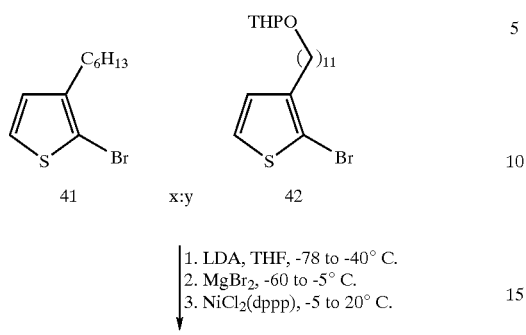
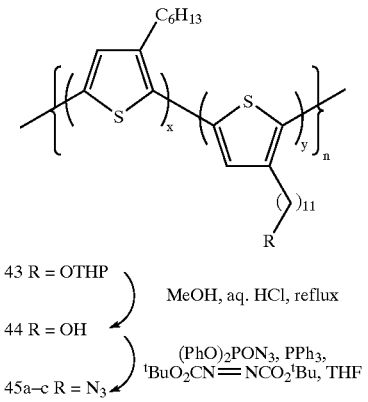
Scheme 12
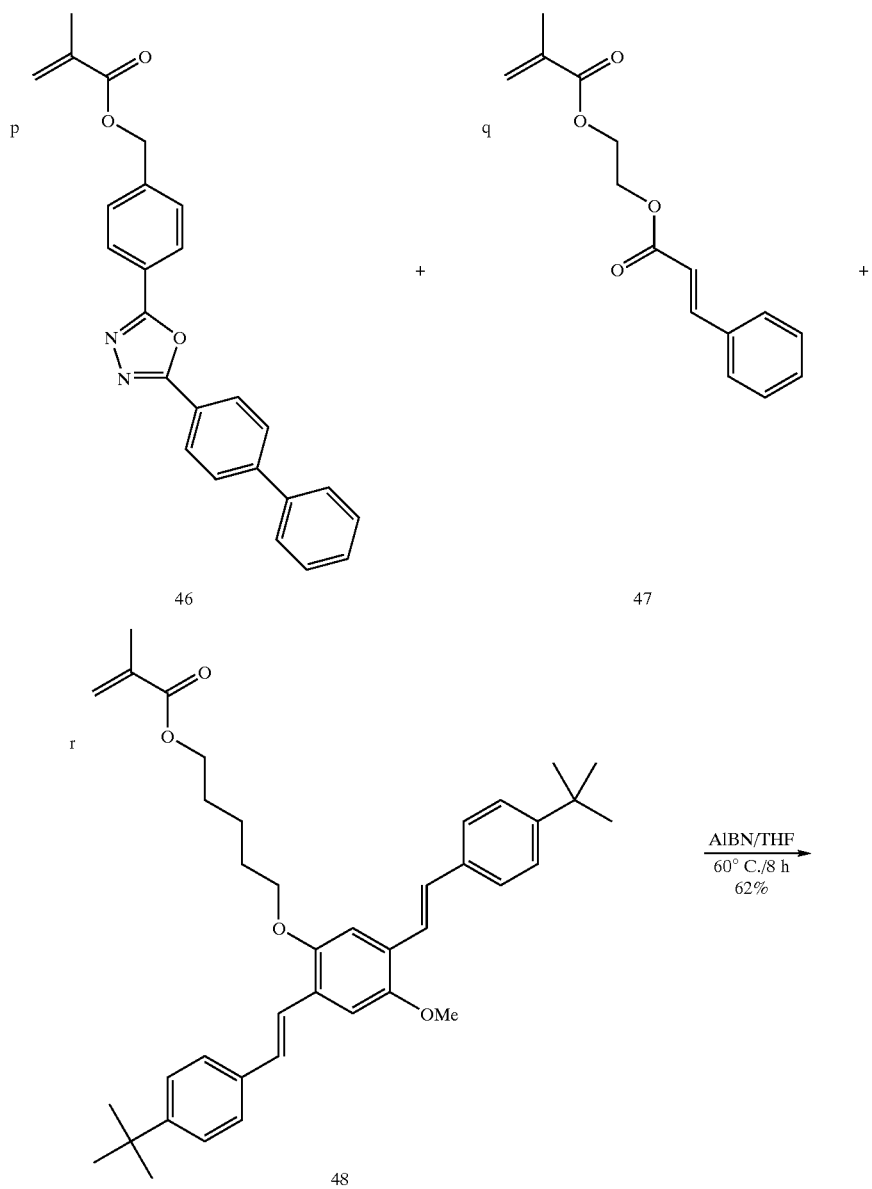

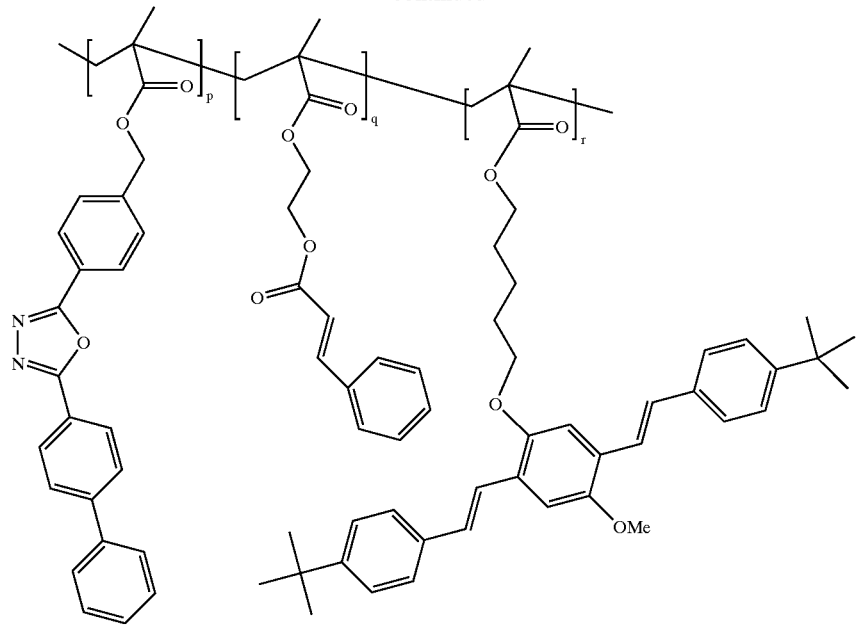

49

What is claimed is:

1. A process for the production of an optical device, which process comprises providing a luminescent film-forming solvent processable polymer and cross-linking the solvent processable polymer under conditions so as to increase its molar mass whereby the polymer is made resistant to solvent dissolution and retains its semiconductive and luminescent properties.

2. A process according to claim 1, wherein the optical device comprises an electroluminescent device.

3. A process according to claim 1, wherein the step of cross-linking the solvent processable polymer is effected using a cross-linking method selected from thermal cross-linking, chemical cross-linking or photochemical cross-linking.

4. A process according to claim 1, wherein the polymer includes a luminescent main chain.

5. A process according to claim 1, wherein the polymer includes a luminescent side chain.

6. A process according to claim 5, wherein the luminescent side chain is linked to the polymer main chain by a spacer.

7. A process according to claim 5, wherein the polymer comprises a polymethacrylate.

8. A process according to claim 1, wherein the polymer includes a charge transport segment in the polymer main chain or covalently linked thereto in a charge transport side chain.

9. A process according to claim 1, which process further comprises depositing a layer of an electroactive polymer on the cross-linked semiconductive polymer.

10. A cross-linked semiconductive polymer capable of luminescence in an optical device, and being resistant to solvent dissolution, which polymer is obtainable according to a process comprising providing a luminescent film-forming solvent processable polymer and cross-linking the solvent processable polymer under conditions so as to increase its molar mass whereby the polymer is made resistant to solvent dissolution and retains its semiconductive and luminescent properties.

11. A polymer according to claim 10, wherein the cross-linking is formed in a step selected from thermal cross-linking, chemical cross-linking and photochemical cross-linking.

12. A polymer according to claim 10, which includes a luminescent main chain.

13. A polymer according to claim 12, wherein the main chain comprises a polythiophene copolymer capable of luminescence.

14. A polymer according to claim 10, which includes luminescent side chain.

15. A polymer according to claim 14, wherein the luminescent side chain is linked to the polymer main chain by a spacer.

16. A polymer according to claim 14, wherein the polymer comprises a polymethacrylate polymer capable of luminescence.

17. A polymer according to claim 10, which includes a charge transport segment in the polymer main chain or covalently linked thereto in a charge transport side chain.

18. An optical device which comprises a substrate and a cross-linked semiconductive polymer as defined in claim 10, supported on the substrate.

19. An optical device according to claim 18, which comprises an electroluminescent device.

20. An optical device according to claim 18, further comprising a layer of an electroactive polymer on the semiconductive polymer.

21. An optical device according to claim 18, wherein the cross-linking is formed in a step selected from thermal cross-linking, chemical cross-linking and photochemical cross-linking.

22. An optical device according to claim 18, wherein the cross-linked semiconductive polymer includes a luminescent main chain.

23. An optical device according to claim 22, wherein the main chain of the cross-linked semiconductive polymer comprises a polythiophene copolymer capable of luminescence.

24. An optical device according to claim 18, wherein the cross-linked semiconductive polymer includes luminescent side chain.

25. An optical device according to claim 24, wherein the luminescent side chain is linked to the polymer main chain by a spacer.

26. An optical device according to claim 24, wherein the luminescent side chain comprises a distryryl benzene derivative.

27. An optical device according to claim 24, wherein the cross-linked semiconductive polymer comprises a polymethacrylate polymer of luminescence.

28. An optical device according to claim 18, wherein cross-linked semiconductive polymer includes a charge transport segment in the polymer main chain or covalently linked thereto in a charge transport side chain.

* * * * *